(12) United States Patent
Nakano

(10) Patent No.: US 6,519,193 B2
(45) Date of Patent: Feb. 11, 2003

(54) SEMICONDUCTOR INTEGRATED CIRCUIT DEVICE HAVING SPARE WORD LINES

(75) Inventor: Masaya Nakano, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/096,427

(22) Filed: Mar. 13, 2002

(65) Prior Publication Data
US 2003/0012059 A1 Jan. 16, 2003

(30) Foreign Application Priority Data
Jul. 13, 2001 (JP) ........................................ 2001-213952

(51) Int. Cl.⁷ ............................................... G11C 7/00
(52) U.S. Cl. ........................ 365/200; 365/203; 365/205
(58) Field of Search ................................. 365/200, 203, 365/205, 201

(56) References Cited

U.S. PATENT DOCUMENTS 5,796,271 A * 8/1998 Kumar ......................... 326/10
6,144,599 A * 11/2000 Akita et al. ................... 365/203
6,333,877 B1 * 12/2001 Nagaoka et al. ............. 365/200

* cited by examiner

Primary Examiner—Huan Hoang
(74) Attorney, Agent, or Firm—McDermott, Will & Emery

(57) ABSTRACT

In the case where a defective normal word line in a memory cell array has been replaced with a spare word line, a word line precharge signal output from a word line precharge signal generation circuit is activated to L level during a precharge period. As a result, a normal word line activation circuit holds the defective normal word line at a precharge potential level. Accordingly, the semiconductor integrated circuit device stably conducts sensing operation even when the defective normal word line replaced with the spare word line is short-circuited to a bit line.

5 Claims, 20 Drawing Sheets

SEMICONDUCTOR INTEGRATED CIRCUIT DEVICE HAVING SPARE WORD LINES

BACKGROUND OF THE INVENTION

1. Field of the Invention

The present invention generally relates to a semiconductor integrated circuit device. More particularly, the present invention relates to a semiconductor integrated circuit device having spare word lines.

2. Description of the Background Art

Among semiconductor integrated circuit devices, a dynamic semiconductor memory device (hereinafter, referred to as DRAM (dynamic random access memory)), for example, has a plurality of spare word lines in addition to normal word lines as redundancy technology.

For example, when one of a plurality of memory cells connected to a normal word line becomes defective, the DRAM having spare word lines replaces the normal word line connected to the defective memory cell with a spare word line. When a normal word line itself becomes defective due to some factor, the DRAM replaces the defective normal word line with a spare word line.

When a defective normal word line is replaced with a spare word line, the potential on the replaced defective normal word line is normally fixed to the ground potential. As a result, the replaced defective normal line will not be accessed, and therefore will not affect the sense amplifier operation.

However, in the case where the replaced defective normal word line is short-circuited with high resistance to a bit line BL or ZBL connected to a sense amplifier, it affects the sense amplifier operation.

FIG. 22 is a schematic block diagram showing a region in a memory cell array of the DRAM.

Referring to FIG. 22, each memory cell MC is connected to a word line WL of a corresponding row. Each memory cell MC includes an N-channel access MOS (metal oxide semiconductor) transistor QN1 and a storage capacitor C1.

The memory cell array includes normal word lines NWL for use in normal operation, and spare word lines SWL used as a substitute for a defective normal word line NWL.

The memory cell array further includes bit line pairs BL, ZBL. A sense amplifier SA and an equalizer EQ are connected to the bit line pairs BL, ZBL.

It is now assumed that, in the memory cell array of FIG. 22, a normal word line NWL0 is replaced with a spare word line SWL0 due to some factor, and the replaced defective normal word line NWL is short-circuited with high resistance to a bit line BL.

During a precharge period, the bit line pairs BL, ZBL are held at a precharge potential equal to Vcc/2 (hereinafter, referred to as VBL potential level) by the equalizer EQ.

However, since the bit line BL is short circuited with high resistance to the defective normal word line NWL0, the VBL potential on the bit line pair BL, ZBL leaks to the short-circuited defective normal word line NWL0. As a result, the VBL potential on the bit line pair BL, ZBL falls from the intermediate potential.

FIG. 23 is a timing chart illustrating the operation of reading L level in the memory cell (which is a part of the sense amplifier operation) in the case where the bit line BL is short-circuited with high resistance to the defective normal word line NWL0 in FIG. 22.

Referring to FIG. 23, since the bit line BL is short-circuited with high resistance to the defective normal word line NWL0, the VBL potential falls from the intermediate potential during a precharge period. The sense amplifier SA starts sensing operation after the precharge period. Since the VBL potential is lower than the normal level, it is difficult for the sense amplifier SA to read L level from the memory cell.

The relation between the VBL potential level and the L level read potential $\Delta$ is given by the following equation:

$$\Delta V = -VBL/(1+Cb/Cs) \tag{1}$$

In the equation (1), Cb is a capacitance of the memory cell MC, and Cs is a stray capacitance of the bit line BL, ZBL.

According to the equation (1), the read potential $\Delta V$ reduces as the VBL potential level falls to a lower level, thereby possibly causing defective sense amplifier operation.

SUMMARY OF THE INVENTION

It is an object of the present invention to provide a semiconductor integrated circuit device capable of stably conducting sensing operation even when a defective normal word line replaced with a spare word line is short-circuited to a bit line.

A semiconductor integrated circuit device according to the present invention includes: a plurality of memory cells arranged in rows and columns; a plurality of normal word lines arranged respectively corresponding to the memory cell rows; a plurality of spare word lines arranged respectively corresponding to the memory cell rows, for substituting for a defective normal word line of the plurality of normal word lines; a plurality of bit line pairs arranged respectively corresponding to the memory cell columns; a equalizer circuit for, precharging the plurality of bit line pairs to a prescribed potential; a sense amplifier circuit for amplifying a potential difference in the bit line pair; a spare row determination circuit for replacing the defective normal word line with the spare word line; and a word line precharge circuit for precharging the defective normal word line replaced by the spare row determination circuit to the prescribed potential.

Preferably, the word line precharge circuit includes a word line precharge determination circuit for determining whether the replaced defective normal word line is to be precharged to the predetermined potential or not, and a word line potential level control circuit for controlling a potential level on the replaced defective normal word line in response to the determination result of the word line precharge determination circuit.

Thus, the replaced defective normal word line has the same potential as that of the bit line pair. Therefore, the potential on the bit line pair will not be reduced during the precharge period.

Preferably, the word line precharge determination circuit outputs a determination signal to the word line potential level control circuit in response to a control signal for controlling operation of the sense amplifier circuit.

Preferably, the word line precharge circuit renders the replaced defective normal word line in a high impedance state during operation of the sense amplifier circuit.

Thus, the potential on the replaced defective normal word line will not affect the potential on the bit line pair during sense amplifier operation, whereby the sense amplifier operation is facilitated.

Preferably, the word line precharge circuit reduces the potential on the replaced defective normal word line during operation of the sense amplifier circuit.

Thus, the potential on the replaced defective normal word line will not affect the potential on the bit line pair during sense amplifier operation, whereby the sense amplifier operation is facilitated.

According to the present invention, the potential level on the bit line BL or ZBL short-circuited to the defective normal word line NWL will not fall from the precharge potential level during the precharge period. As a result, the sense amplifier operation is stabilized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
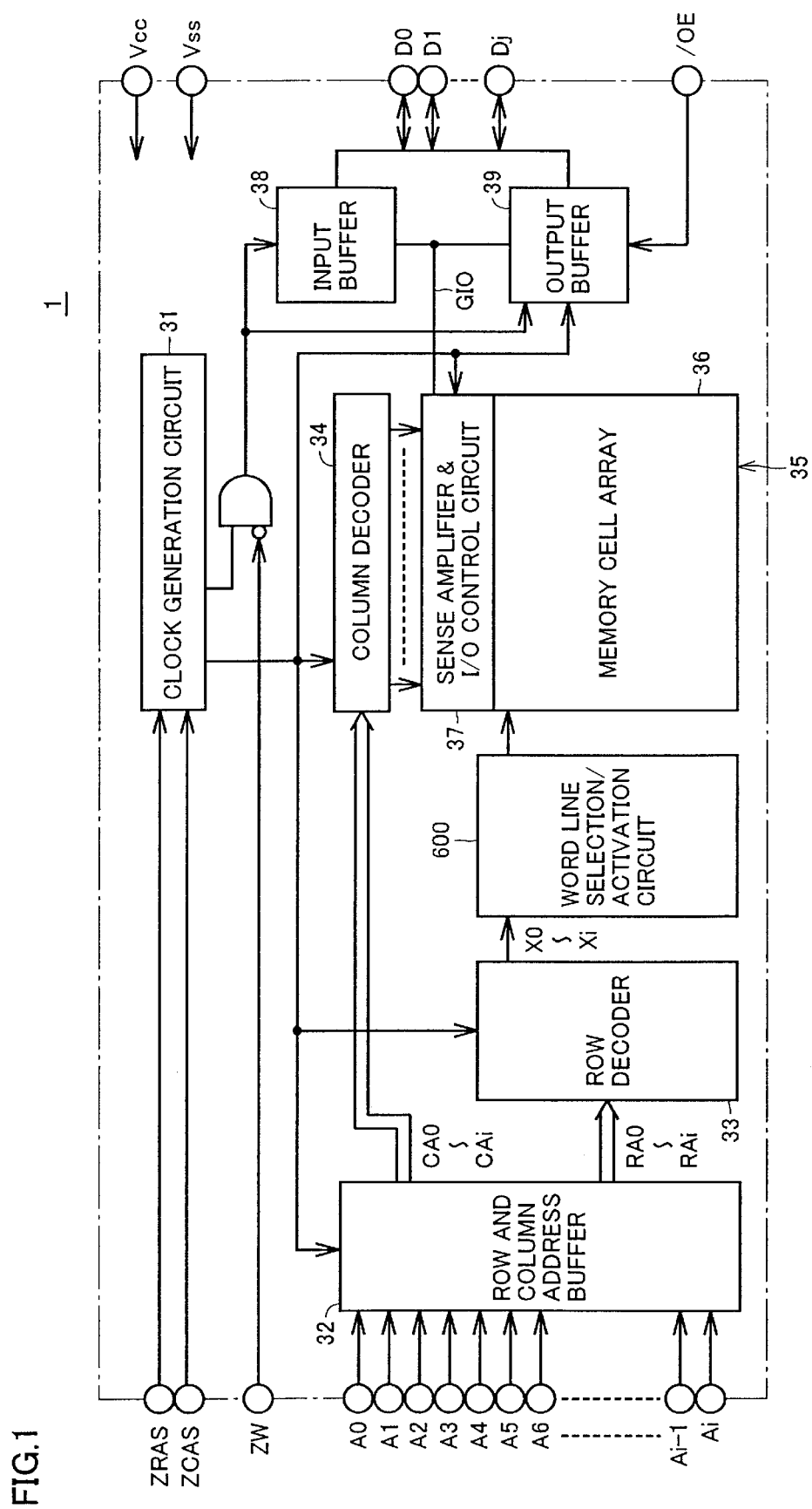
FIG. 1 is a schematic block diagram showing the overall configuration of a DRAM of the semiconductor integrated circuit devices according to a first embodiment of the present invention.

Hereinafter, embodiments of the present invention will be described in detail in conjunction with the accompanying drawings. Note that the same or corresponding portions are denoted with the same reference numerals and characters throughout the figures, and description thereof will not be repeated.

[First Embodiment]

FIG. 1 is a schematic block diagram showing the overall structure of a DRAM of the semiconductor integrated circuit devices according to the first embodiment of the present invention.

Referring to FIG. 1, the DRAM 1 includes a clock generation circuit 31, a row and column address buffer 32, a row decoder 33, a column decoder 34, a memory mat 35, an input buffer 38, an output buffer 39, and a word line selection/activation circuit 600.

The memory mat 35 includes a memory cell array 36 and a sense amplifier & input/output (I/O) control circuit 37.

The clock generation circuit 31 selects a prescribed operation mode based on external control signals ZRAS, ZCAS, ZW in order to generally control the DRAM 1.

The row and column address buffer 32 applies a row address signal RA0 to RAi and a column address signal CA0 to CAi to the row decoder 33 and the column decoder 34, respectively, based on an external address signal A0 to Ai (where i is an integer equal to or larger than zero).

The memory cell array 36 includes a plurality of memory cells each storing 1-bit data. Each memory cell is arranged at a prescribed address determined by a row address and a column address.

The row decoder 33 outputs a decode signal X0 to Xi for designating a row address of the memory cell array 36, in response to the row address signal RA0 to RAi applied from the row and column address buffer 32. The column decoder 34 designates a column address of the memory cell array 36 in response to the column address signal CA0 to CAi applied from the row and column address buffer 32.

The word line selection/activation circuit 600 activates a normal word line NWL or a spare word line SWL in the memory cell array in response to the decode signal X0 to Xi applied from the row decoder 33.

The sense amplifier & I/O control circuit 37 connects a memory cell corresponding to the address designated by the row decoder 33 and the column decoder 34 to one end of a global data input/output (I/O) line pair GIO. The other end of the global data I/O line pair GIO is connected to the input buffer 38 and the output buffer 39. In the write mode, the input buffer 38 applies external input data Dj (where j is an integer equal to or larger than zero) to the selected memory cell through the global data I/O line pair GIO in response to a control signal ZW. In the read mode, the output buffer 39 outputs read data Da from the selected memory cell to the outside in response to an external control signal ZOE.

Figure 2:
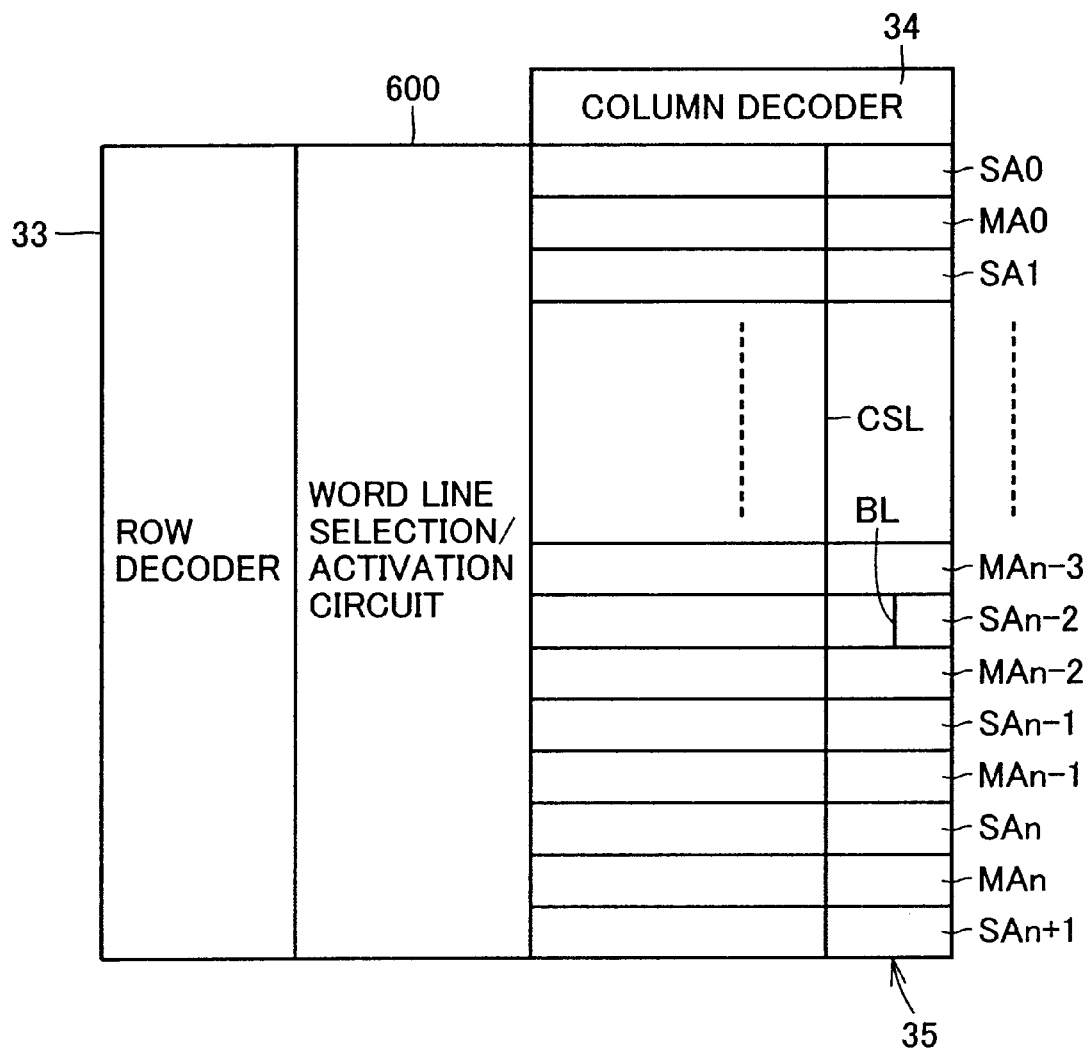
FIG. 2 is a block diagram showing the configuration of a memory mat and its peripheral circuitry in FIG. 1.

FIG. 2 is a block diagram showing the configuration of the memory mat 35 and its peripheral circuitry in FIG. 1.

Referring to FIG. 2, the memory mat 35 is generally arranged in a rectangular region. The memory cell array 36 is divided into a plurality of memory cell array blocks MA0 to MAn (where n is an integer equal to or larger than zero). The sense amplifier & I/O control circuit 37 is divided into a plurality of sense amplifier bands SA0 to SAn+1. The memory cell array blocks MA0 to MAn and the sense amplifier bands SA0 to SAn+1 are arranged in the direction of the longer side of the rectangular region. Each of the memory cell array blocks MA0 to MAn are arranged between the corresponding sense amplifier bands SA0 to SAn+1.

The row decoder 33 and the word line selection/activation circuit 600 are arranged along one of the longer sides of the memory mat 35. The column decoder 34 is arranged along one of the shorter sides of the memory mat 35.

Figure 3:
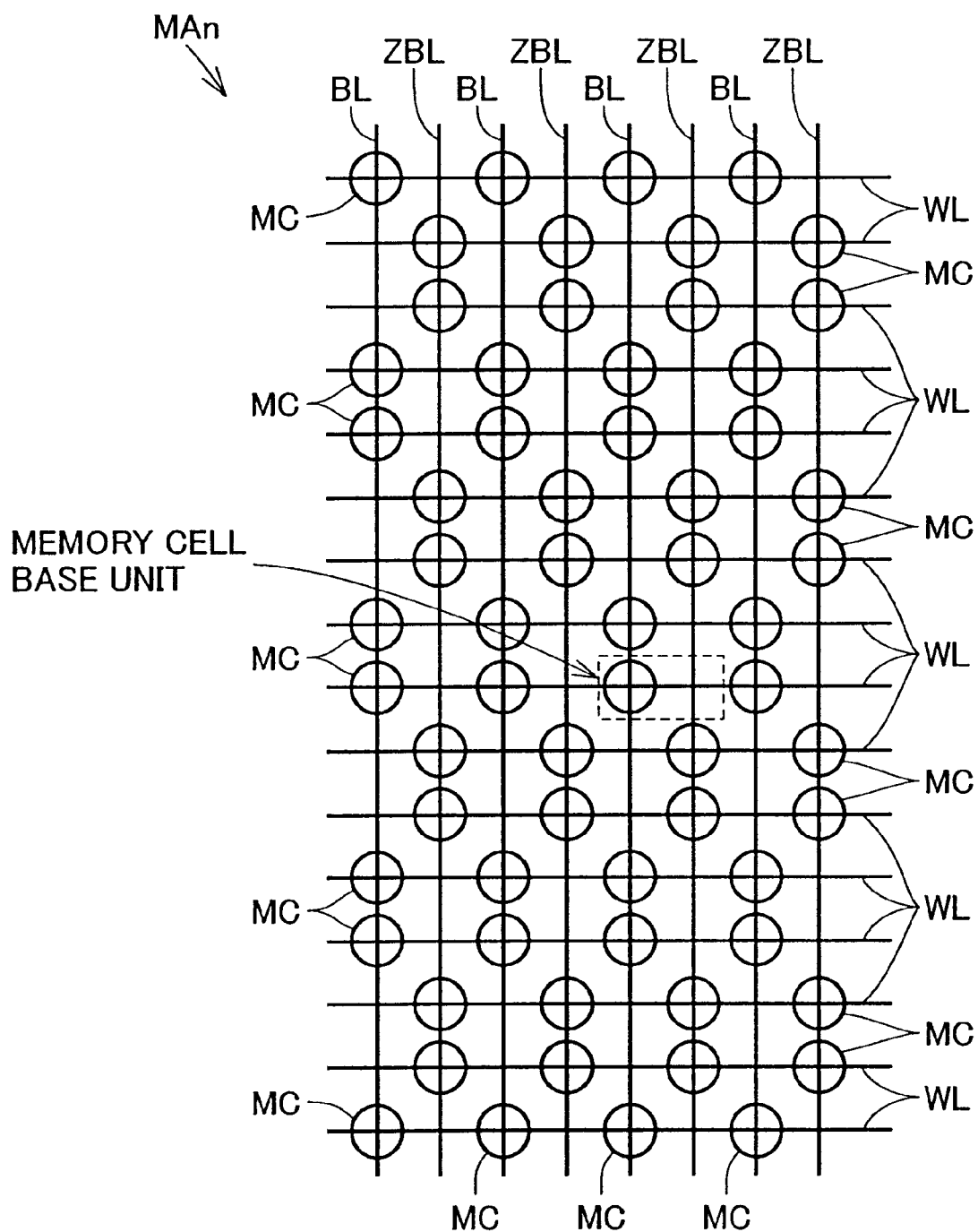
FIG. 3 is a diagram showing a part of a memory cell array block in FIG. 2.

FIG. 3 is a diagram showing a part of the memory cell array block MAn in FIG. 2.

Referring to FIG. 3, the memory cell array block MAn includes a plurality of memory cells arranged in rows and columns, word lines WL arranged corresponding to the respective rows, and bit line pairs BL, ZBL arranged corresponding to the respective columns. Each memory cell MC is located at one of two intersections of two bit lines BL, ZBL and a word line WL extending perpendicular thereto.

Figure 4:
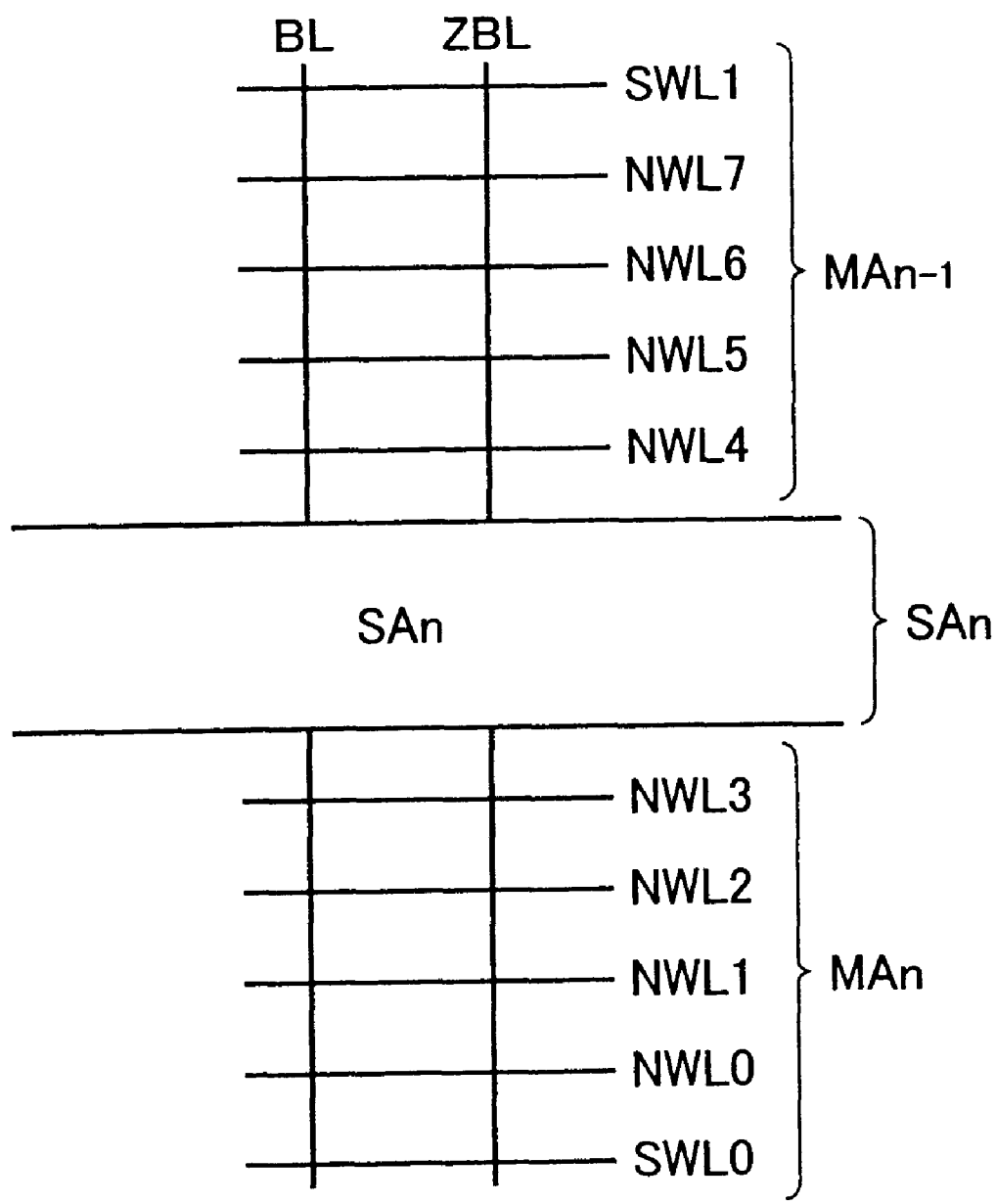
FIG. 4 is a schematic diagram showing arrangement of word lines in the memory cell array block.

FIG. 4 is a schematic diagram showing arrangement of the word lines in the memory cell array block.

Referring to FIG. 4, for simplification of the description, it is herein assumed that five word lines are arranged in each memory cell array block. More specifically, normal word lines NWL4 to NWL7 and a spare word line SWL1 are arranged in the memory cell array block MAn-1. Normal word lines NWL0 to NWL3 and a spare word line SWL0 are arranged in the memory cell array block MAn.

The normal word lines NWL0 to NWL7 are word lines WL for use in normal operation. When a memory cell MC connected to the normal word line NWL0 to NWL3 becomes defective, the spare word lines SWL0 is used as a substitute for the normal word line NWL connected to the defective memory cell. Even when any one of the normal word lines NWL0 to NWL3 itself becomes defective, the spare word line SWL0 is used as a substitute for the defective normal word line NWL. The spare word line SWL1 functions in the same manner as that of the spare word line SWL0 for the normal word lines NWL4 to NWL7.

Note that, in FIG. 4, four normal word lines NWL and a single spare word line SWL are provided in each memory cell array block MAn. However, five or more normal word lines NWL and two or more spare word lines may be provided in each memory cell array block MAn.

Figure 5:
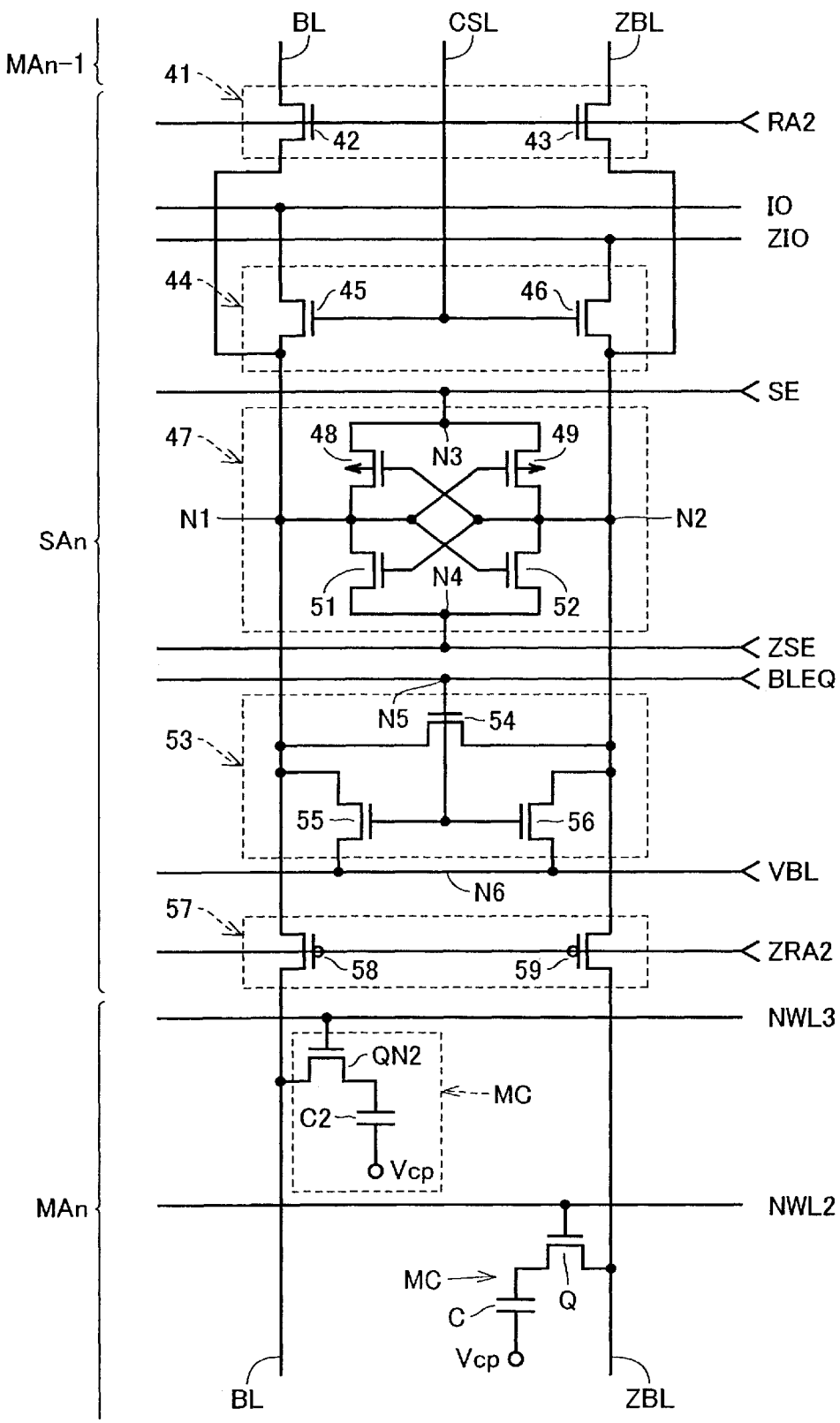
FIG. 5 is a circuit diagram showing the configuration of a sense amplifier band in FIG. 4 and its peripheral circuitry.

FIG. 5 is a circuit diagram showing the configuration of the sense amplifier band SAn in FIG. 4 and its peripheral circuitry.

Referring to FIG. 5, the memory cells MC in each memory cell array block each includes an N-channel access MOS transistor QN2 and a storage capacitor C2. The N-channel MOS transistor QN2 and the capacitor C2 are connected in series between a corresponding bit line BL or ZBL and a cell potential Vcp line. The N-channel MOS transistor QN2 has its gate connected to a corresponding normal word line NWL or spare word line SWL.

The sense amplifier band SAn includes transfer gates 41, 57, a column selection gate 44, a sense amplifier 47 and an equalizer 53.

The transfer gate 41 includes N-channel MOS transistors 42, 43. The N-channel MOS transistors 42, 43 are respectively connected between input/output (I/O) nodes N1, N2 of the sense amplifier 47 and a corresponding bit line pair BL, ZBL in the memory cell array block MAn-1, respectively. The N-channel MOS transistors 42, 43 receive an address signal RA2 at their gates.

The transfer gate 57 includes P-channel MOS transistors 58, 59. The P-channel MOS transistors 58, 59 are respectively connected between the I/O nodes N1, N2 and a corresponding bit line pair BL, ZBL in the memory cell array block MAn. The P-channel MOS transistors 58, 59 receive an address signal ZRA2 at their gates.

The circuitry in the sense amplifier band SAn is shared by the two memory cell array blocks MAn-1, MAn located on both side of the sense amplifier band SAn. When the memory cell array block MAn-1 is selected, the address signal RA2 is activated. As a result, each transistor in the transfer gate 41 is turned on, and each transistor in the transfer gate 57 is turned off. When the memory cell array block MAn is selected, the address signal/RA2 is activated. As a result, each transistor in the transfer gate 57 is turned on, and each transistor in the transfer gate 41 is turned off.

The column selection gate 44 includes N-channel MOS transistors 45, 46. The N-channel MOS transistors 45, 46 are respectively connected between the I/O nodes N1, N2 and data I/O lines IO, ZIO. The N-channel MOS transistors 45, 46 have their respective gates connected to the column decoder 34 through a column selection line CSL. When the column selection line is activated to H level by the column decoder 34, the N-channel MOS transistors 45, 46 are turned ON. As a result, the bit line pair BL, ZBL of the memory cell array block MAn-1 or MAn is coupled to the data I/O line pair IO, ZIO. The other end of the data I/O line pair IO, ZIO is connected to one end of the global data I/O line pair GIO through a not-shown block selection switch.

The sense amplifier 47 includes P-channel MOS transistors 48, 49 and N-channel MOS transistors 51, 52. The P-channel MOS transistors 48, 49 are respectively connected between the I/O nodes N1, N2 and a node N3. The N-channel MOS transistors 51, 52 are respectively connected between the I/O nodes N1, N2 and a node N4. The transistors 48, 51 have their respective gates connected to the node N2, and the transistors 49, 52 have their respective gates connected to the node N1. The nodes N3, N4 receive sense amplifier activation signals SE, ZSE, respectively. When the sense amplifier activation signals SE, ZSE go to H level and L level, respectively, the sense amplifier 47 responsively amplifies a small potential difference between the nodes N1 and N2, that is,, between the bit lines BL, ZBL in the memory cell array block MAn-1 or MAn to the power supply potential Vcc.

The equalizer 53 includes an N-channel MOS transistor 54 connected between the I/O nodes N1 and N2, and N-channel MOS transistors 55, 56. The N-channel MOS transistors 55, 56 are respectively connected between the I/O nodes N1, N2 and a node N6. The N-channel MOS transistors 54 to 56 have their respective gates connected to a node N5. The node N5 receives a bit line equalize signal BLEQ, and the node N6 receives a precharge potential VBL (=Vcc/2). The equalizer 53 equalizes the potential at the nodes N1, N2, that is, the potentials on the bit lines BL, ZBL in the memory cell array block MAn−1 or MAn to a precharge potential VBL in response to activation, (level) of the bit line equalize signal BLEQ. Note that the signals SE, ZSE, BLEQ and the precharge potential VBL are applied from the clock generation circuit 31 of FIG. 1.

Figure 6:
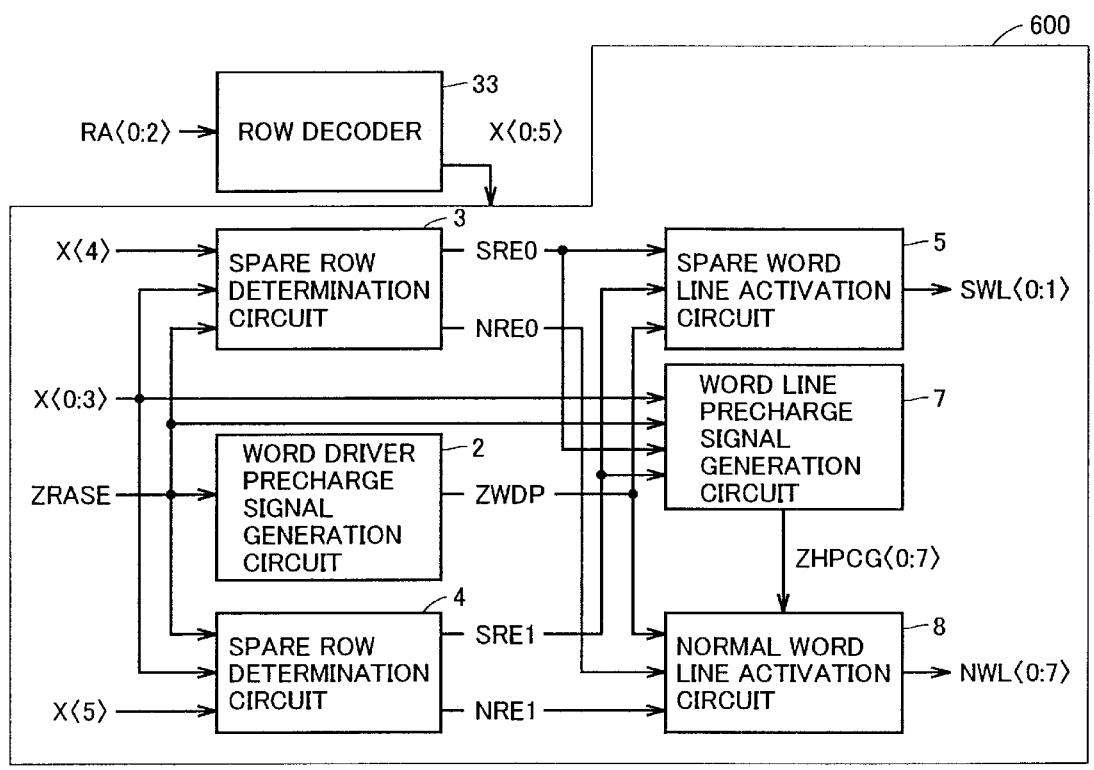
FIG. 6 is a block diagram showing the structure of a word line selection/activation circuit for selecting a normal word line or a spare word line and activating the selected normal word line or spare word line.

FIG. 6 is a block diagram showing the configuration of the word line selection/activation circuit for selecting a normal word line NWL or a spare word line SWL and activating the selected normal word line NWL or spare word line SWL.

Referring to FIG. 6, the word line selection/activation circuit 600 includes spare row determination circuits 3, 4, a word driver precharge signal generation circuit 2, a normal word line activation circuit 8, a spare word line activation circuit 5, and a word line precharge signal generation circuit 7.

The spare row determination circuit 3 is a circuit for selecting a normal word line NWL in the memory array block MAn. The spare row determination circuit 3 also serves as a circuit for replacing a defective normal word line NWL with a spare word line SWL0. The spare row determination circuit 3 receives a decode signal X4 applied from the row decoder 33 and a control signal ZRASE applied from the clock generation circuit 31, and outputs to the spare word line activation circuit 5 a signal SRE0 for activating the spare word line SWL0 as well as outputs to the normal word line activation circuit 8 a signal NRE0 for activating the selected normal word line.

The spare row determination circuit 4 functions in the same manner as that of the spare row determination circuit 3 for the word lines WL in the memory cell array block MAn−1. The spare row determination circuit 4 receives a decode signal X5 applied from the row decoder 33 and a control signal ZRASE applied from the clock generation circuit 31, and outputs to the spare word line activation circuit 5 a signal SRE1 for activating the spare word line SWL1 as well as outputs to the normal word line activation circuit 8 a signal NRE1 for activating the selected normal word line.

The word driver precharge signal generation circuit 2 is a circuit for rendering the spare word line activation circuit 5 and the word line activation circuit 8 in an operating state. The word driver precharge signal generation circuit 2 receives a control signal ZRASE, and outputs a signal ZWDP to the spare word line activation circuit 5 and the normal word line activation circuit 8.

The spare word line activation circuit 5 activates a spare word line SWL0 or SWL1. The normal word line activation circuit 8 activates a normal word line NWL0 to NWL7.

The word line precharge signal generation circuit 7 is a circuit for rendering the potential level of the defective normal word line NWL replaced with the spare word line SWL at the precharge potential VBL. The word line precharge signal generation circuit 7 receives a decode signal Xm (where m is an integer equal to or larger than zero) applied from the row decoder 33, a control signal ZRASE applied from the clock generation circuit 31, a signal SRE0 applied from the spare row determination circuit 3 and a signal SRE1 applied from the spare row determination circuit 4, and outputs a signal ZHPCGk (where k is an integer equal to or larger than zero) to the normal word line activation circuit 8.

Figure 7:
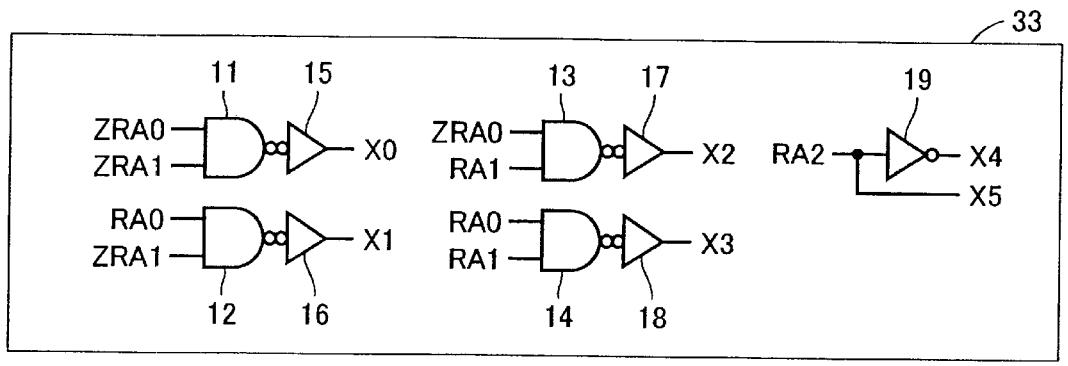
FIG. 7 is a circuit diagram showing the configuration of a row decoder corresponding to the word lines in FIG. 4.

FIG. 7 is a circuit diagram showing the structure of the row decoder 33 corresponding to the word lines in FIG. 6.

Referring to FIG. 7, the row decoder 33 includes logic gates 11 to 14 and inverters 15 to 19.

The logic gate 11 receives address signals, ZRA0 and ZRA1 from the row and column address buffer 32, and outputs the NAND operation result thereof. The inverter 15 inverts the output signal of the logic gate 11 for output as a decode signal X0. The logic gate 12 receives address signals RA0 and ZRA1 from the row and column address buffer 32, and outputs the NAND operation result thereof. The inverter 16 inverts the output signal of the logic gate 12 for output as a decode signal X1. The logic gate 13 receives address signals ZRA0 and RA1 from the row and column address buffer 32, and outputs the NAND operation result thereof. The inverter 17 inverts the output signal of the logic gate 13 for output as a decode signal X2. The logic gate 14 receives address signals RA0 and RA1 from the row and column address buffer 32, and outputs the NAND operation result thereof. The inverter 18 inverts the output signal of the logic gate 14 for output as a decode signal X3. The inverter 19 inverts an address signal RA2 output from the row and column address buffer 32 for output as a decode signal X4. The address signal RA2 is output as a decode signal X5 when it is not applied to the inverter 19.

Figure 8:
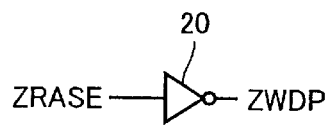
FIG. 8 is a circuit diagram showing the configuration of a word driver precharge signal generation circuit in FIG. 6.

FIG. 8 is a circuit diagram showing the configuration of the word driver precharge signal generation circuit 2 in FIG. 6.

Referring to FIG. 8, the word driver precharge signal generation circuit 2 includes an inverter 20. The inverter 20 inverts a control signal ZRASE applied from the clock generation circuit 31 for output as a word driver precharge signal ZWDP.

Figure 9:
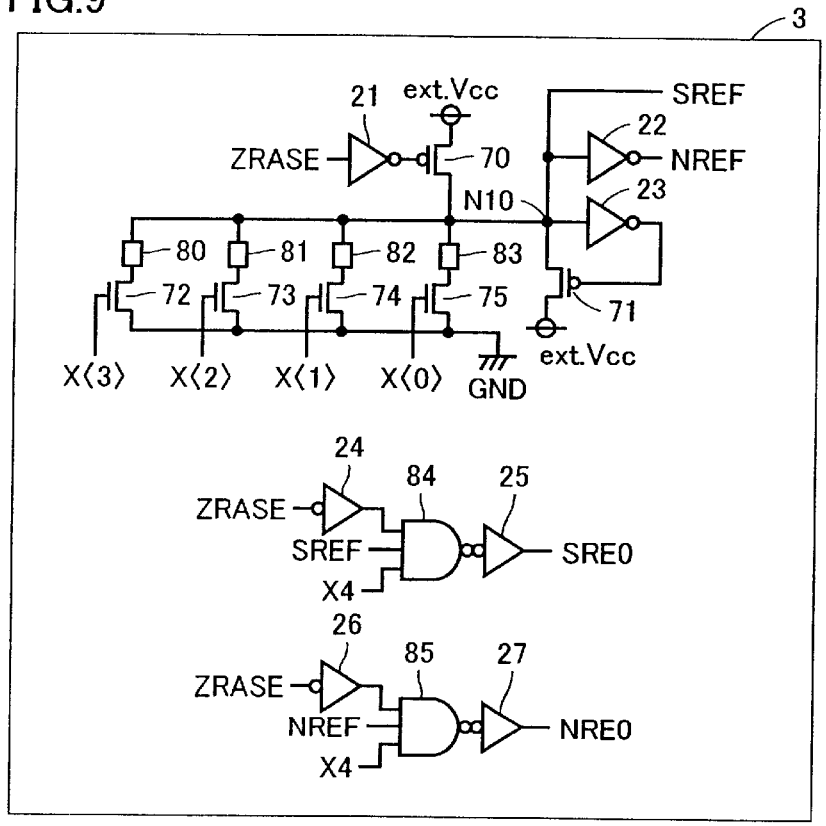
FIG. 9 is a circuit diagram showing the configuration of a spare row determination circuit in FIG. 6.

FIG. 9 is a circuit diagram showing the configuration of the spare row determination circuit in FIG. 6.

Referring to FIG. 9, the spare row determination circuit 3 includes, inverters 21 to 27, P-channel MOS transistors 70, 71, N-channel MOS transistors 72 to 75, fuses 80 to 83 and logic gates 84, 85.

The fuse 80 is connected between a node N10 and the N-channel MOS transistor 72. The fuse 81 is connected between the node N10 and the N-channel MOS transistor 73. Similarly, the fuse 82 is connected between the node N10 and the N-channel MOS transistor 74. The fuse 83 is connected between the node N10 and the N-channel MOS transistor 75. The N-channel MOS transistor 72 receives a decode signal X3 from the row decoder 33 at its gate. Similarly, the N-channel MOS transistor 73 receives a decode signal X2 from the row decoder 33 at its gate. The N-channel MOS transistor 74 receives a decode signal X1 from the row decoder 33 at its gate. The N-channel MOS transistor 75 receives a decode signal X0 from the row decoder 33 at its gate. The N-channel MOS transistors 72 to 75 have their respective sources connected to a ground node GND.

The P-channel MOS transistor 70 is connected between a node receiving an external power supply potential ext.Vcc and the node N10. The P-channel MOS transistor 70 has its gate connected to the inverter 21. The inverter 21 inverts a control signal ZRASE applied from the clock generation circuit 31 for transmission to the gate of the P-channel MOS transistor 70. A signal SREF is output from the node N10.

The inverter 22 receives a signal SREF, and outputs an inverted signal NREF of the signal SREF. The P-channel MOS transistor 71 is connected between the node receiving the external power supply potential ext.Vcc and the node N10. The P-channel MOS transistor 71 has its gate connected to the inverter 23. The inverter 23 receives a signal SREF, and outputs an inverted signal of the signal SREF to the gate of the P-channel MOS transistor 71.

Since the spare row determination circuit 4 has the same structure as that of the spare row determination circuit 3, description thereof will not be repeated. Note that, in the spare row determination circuit 4, a decode signal X5 is applied instead of the decode signal X4 in the spare row determination circuit 3, and determination signals SRE1, SRE1 are output instead of the determination signals SRE0, NRE0.

The inverter 24 inverts the control signal ZRASE. The logic gate 84 receives the output signal of the inverter 24 and the signal SREF and the decode signal X4, and outputs the NAND operation result thereof. The inverter 25 inverts the output signal of the logic gate 84 for output as a determination signal SRE0.

The inverter 26 inverts the control signal ZRASE. The logic gate 85 receives the output signal of the inverter 26 and the signal NREF and the decode signal X4, and outputs the NAND operation result thereof. The inverter 27 inverts the output signal of the logic gate 85 for output as a determination signal NRE0.

Figure 10:
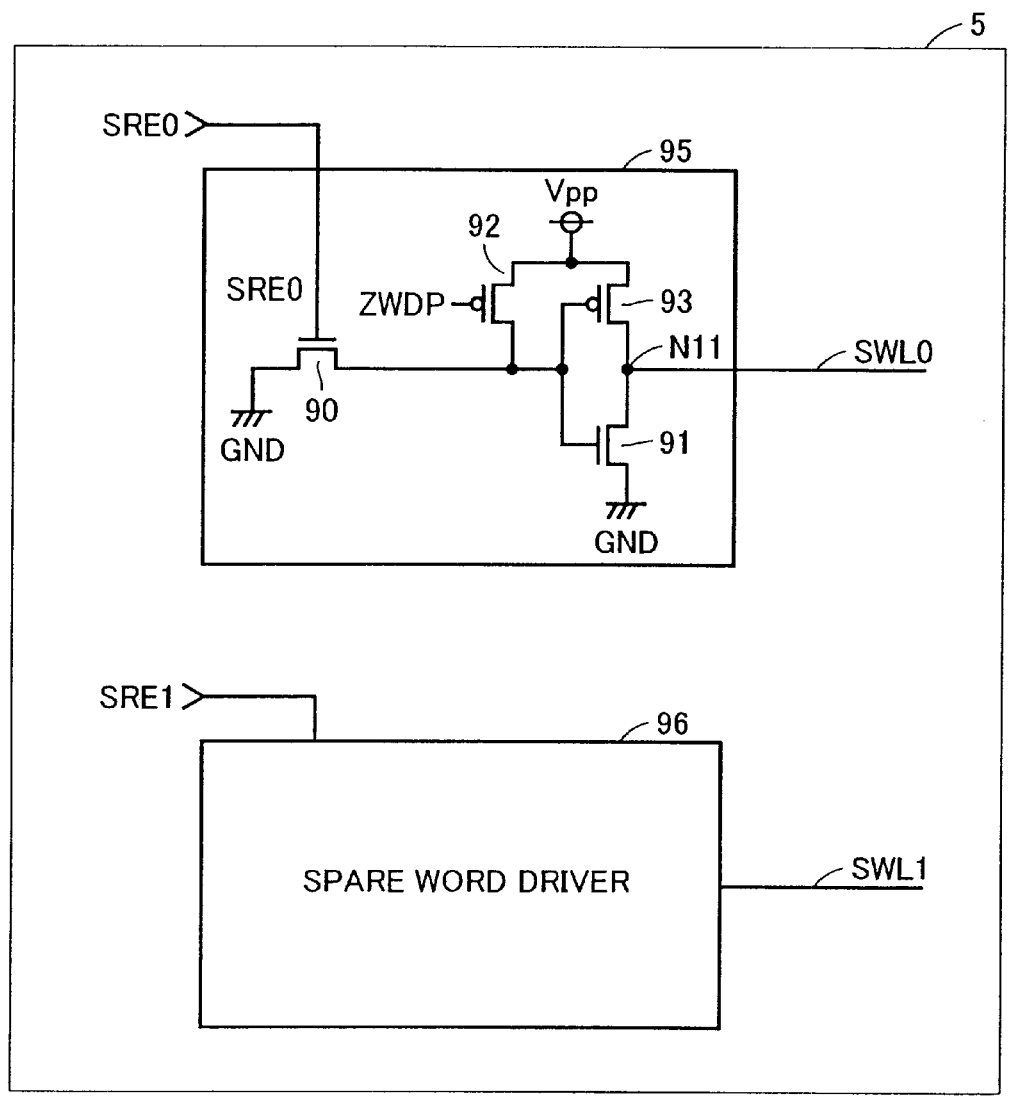
FIG. 10 is a circuit diagram showing the configuration of a spare word line activation circuit in FIG. 6.

FIG. 10 is a circuit diagram showing the configuration of the spare word line activation circuit 5 in FIG. 6.

Referring to FIG. 10, the spare word line activation circuit 5 includes spare word drivers 95, 96. The spare word driver 95 is connected to the spare word line SWL0, and the spare word driver 96 is connected to the spare word line SWL1. The spare word driver.95 receives a determination signal SRE0 from the spare row determination circuit 3. The spare word driver 96 receives a determination signal SRE1 from the spare row determination circuit 4.

The spare word driver 95 includes N-channel MOS transistors 90, 91, and P-channel MOS transistors 92, 93. The P-channel MOS transistor 93 and the N-channel MOS transistor 91 are connected in series between a node receiving a boosted potential Vpp and the ground node GND. The P-channel MOS transistor 92 has its source connected to the node receiving the boosted potential Vpp, and its drain connected to the respective gates of the P-channel MOS transistor 93 and the N-channel MOS transistor 91. The P-channel MOS transistor 92 receives a word driver precharge signal ZWDP at its gate. The N-channel MOS transistor 90 has its source connected to the ground node GND, and its drain connected to the respective gates of the P-channel MOS transistor 93 and the N-channel MOS transistor 91. A node N11, a connection point between the P-channel MOS transistor 93 and the N-channel MOS transistor 91, is connected to the spare word line SWL0. The N-channel MOS transistor 90 receives a determination signal SRE0 from the spare row determination circuit 3 at its gate, and is connected to the respective gates of the P-channel MOS transistor 93 and the N-channel MOS transistor 91.

Since the spare word driver 96 has the same configuration as that of the spare word driver 95, description thereof will not be repeated.

Figure 11:
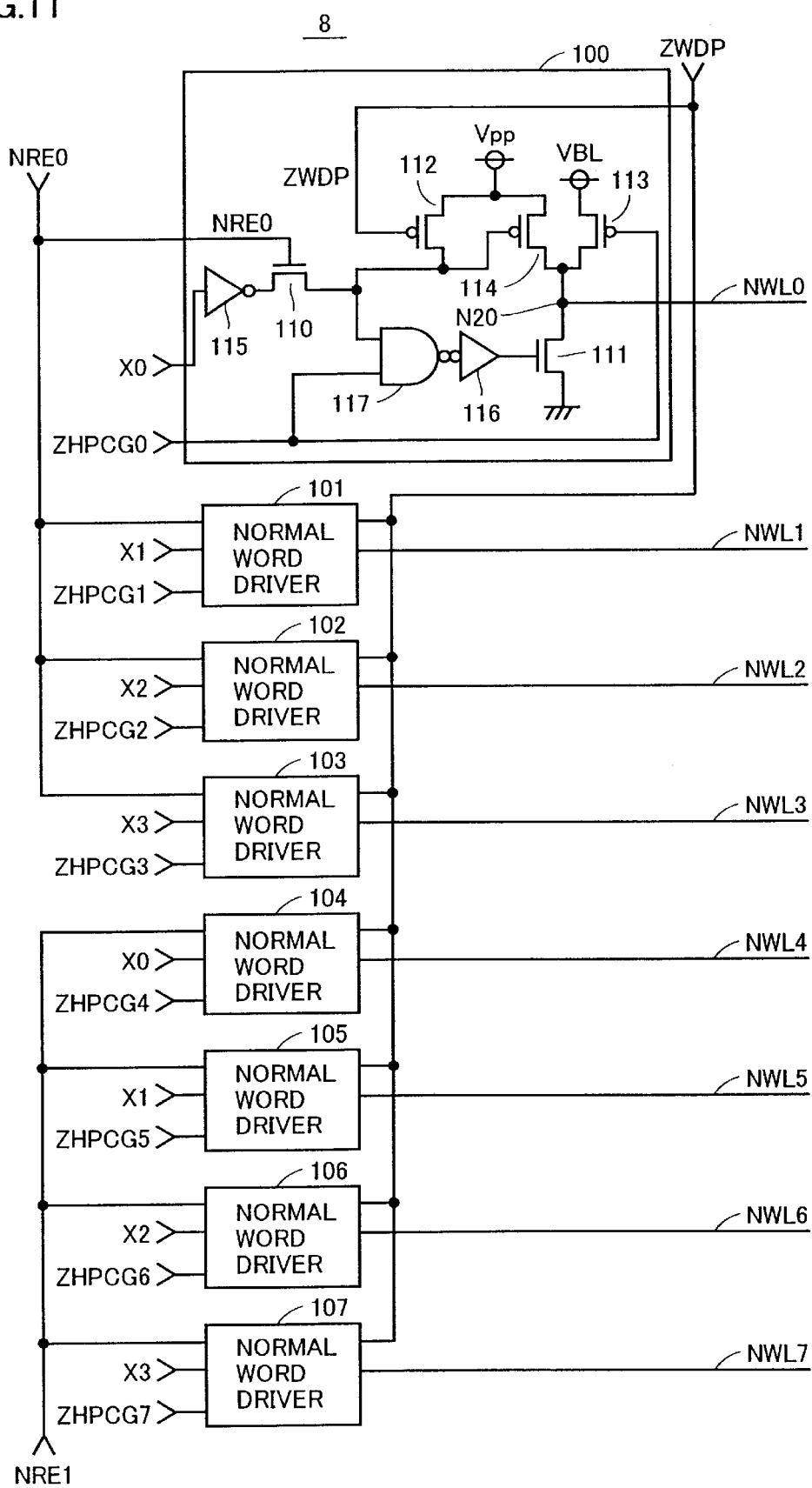
FIG. 11 is a circuit diagram showing the configuration of a normal word line activation circuit in FIG. 6.

FIG. 11 is a circuit diagram showing the configuration of the normal word line activation circuit 8 in FIG. 6.

Referring to FIG. 11, the normal word line activation circuit 8 includes normal word drivers 100 to 107.

The normal word driver 100 receives a word line precharge signal ZHPCG0 output from the word line precharge signal generation circuit 7 described below, a determination signal NRE0 output from the spare row determination circuit 3, and a decode signal X0, and controls the potential on the normal word line NWL0. Similarly, the normal word drivers 101 to 103 respectively receive word line precharge signals ZHPCG1 to ZHPCG3, determination signal NRE0, and decode signals X1 to X3, and control the potential on the normal word lines NWL1 to NWL3.

Similarly, the normal word drivers 104 to 107 respectively receive word line precharge signals ZHPCG4 to ZHPCG7, a determination signal NRE1, and decode signals X0 to X3, and control the potential on the normal word lines NWL4 to NWL7.

A word driver precharge signal ZWDP is applied to every normal word driver 100 to 107.

The normal word driver 100 includes N-channel MOS transistors 110, 111, P-channel MOS transistors 112 to 114, inverters 115, 116 and a logic gate 117.

The P-channel MOS transistor 114 and the N-channel MOS transistor 111 are connected in series between the node receiving the boosted potential Vpp and the ground node GND. A node N20, the connection point between the P-channel MOS transistor 114 and the N-channel MOS transistor 111, is connected to the normal word line NWL0. The P-channel MOS transistor 113 is connected between the precharge potential VBL and the node N20. The P-channel MOS transistor 113 receives a word line precharge signal ZHPCG0 at its gate.

The P-channel MOS transistor 112 has its source connected to the node receiving the boosted potential Vpp, and its drain connected to the gate of the P-channel MOS transistor 114. The P-channel MOS transistor 112 receives a word driver precharge signal ZDWP at its gate.

The N-channel MOS transistor 110 has its drain connected to the drain of the P-channel MOS transistor 112, and its source connected to the inverter 115. The N-channel MOS transistor 110 receives a determination signal NRE0 from the spare row determination circuit 3 at its gate.

The inverter 115 inverts a decode signal X0 for transmission to the source of the N-channel MOS transistor 110.

When the word driver precharge signal ZWDP is active (L level), the logic gate 117 receives the boosted potential Vpp and the word line precharge signal ZHPCG0, and outputs the NAND operation result thereof. When the word driver precharge signal ZWDP is inactive and the determination signal NRE0 is active (H level), the logic gate 117 receives the decode signal X0 and the word line precharge signal ZHPCG0, and outputs the NAND operation result thereof. The inverter 116 inverts the output signal of the logic gate 117 for output to the gate of the N-channel MOS transistor 111.

Since the normal word drivers 101 to 107 have the same configuration as that of the normal word driver 100, description thereof will not be repeated.

Figure 12:
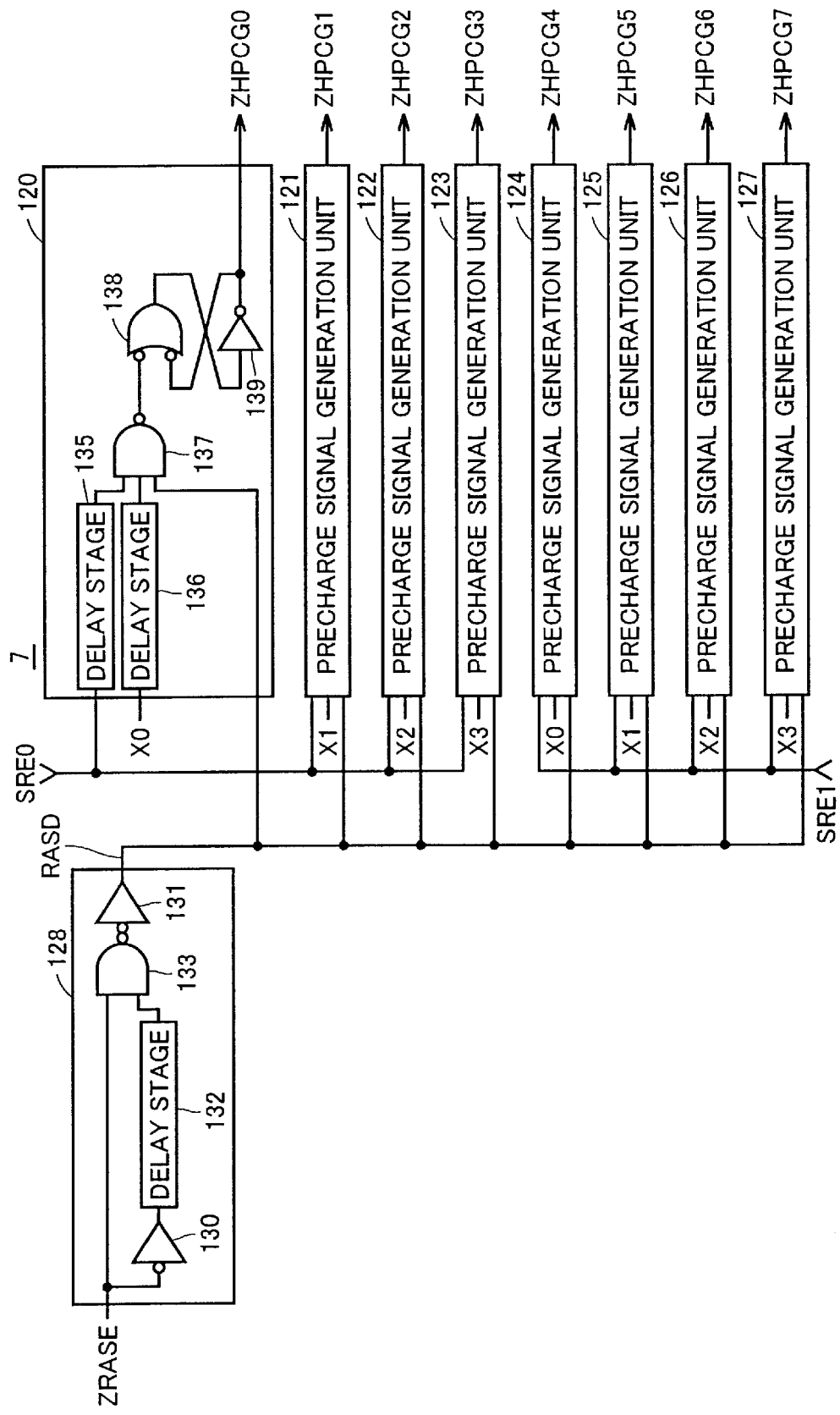
FIG. 12 is a circuit diagram showing the configuration of a word line precharge signal generation circuit in FIG. 6.

FIG. 12 is a circuit diagram showing the configuration of the word line precharge signal generation circuit 7 in FIG. 6.

Referring to FIG. 12, the word line precharge signal generation circuit 7 includes a pulse signal generation circuit 128, and word line precharge signal generation units 120 to 127.

The pulse signal generation circuit 128 includes inverters 130, 131, a delay stage 132 and a logic gate 133. The inverter 130 inverts the control signal ZRASE output from the clock generation circuit 31 for output to the delay stage 132. The delay stage 132 delays the output signal of the inverter 130 by a prescribed delay time for transmission to the logic gate 133. The logic gate 133 receives the control signal ZRASE and the output signal of the delay stage 132, and outputs the NAND operation result thereof. The inverter 131 inverts the output signal of the logic gate 133 for output as a pulse signal RASD.

The word line precharge signal generation unit 120 receives the pulse signal RASD, the determination signal SRE0, and the decode signal X0, and outputs a word line precharge signal ZHPCG0. Similarly, the word line precharge signal generation units 121 to 123 receive the pulse signal RASD, the determination signal SRE0, and the decode signals X1 to X3, and outputs word line precharge signals ZHPCG1 to ZHPCG3, respectively. The word line precharge signal generation units 124 to 127 receive the pulse signal RASD, the determination signal SRE1, and the decode signals X0 to X3, and output word line precharge signals ZHPCG4 to ZHPCG7, respectively.

The word line precharge signal generation unit 120 includes delay stages 135, 136, logic gates 137, 138 and an inverter 139.

The delay stage 135 delays the determination signal SRE0. The delay stage 136 delays the decode signal X0. The logic gate 137 receives the respective output signals of the delay stages 135, 136 and the pulse signal RASD, and outputs the NAND operation result thereof. The logic gate 138 receives the respective output signals of the logic gate 137 and the inverter 139, and outputs the NAND operation result thereof. The inverter 139 inverts the output signal of the logic gate 138 for output as a word line precharge signal ZHPCG0. Note that the word line precharge signal ZHPCG0 is applied to the normal word driver 100 described above.

Since the word line precharge signal generation units 121 to 127 have the same configuration as that of the word line precharge signal generation unit 120, description thereof will not be repeated.

Hereinafter, operation of the word line selection/activation circuit 600 having the aforementioned structure will be described.

Figure 13:
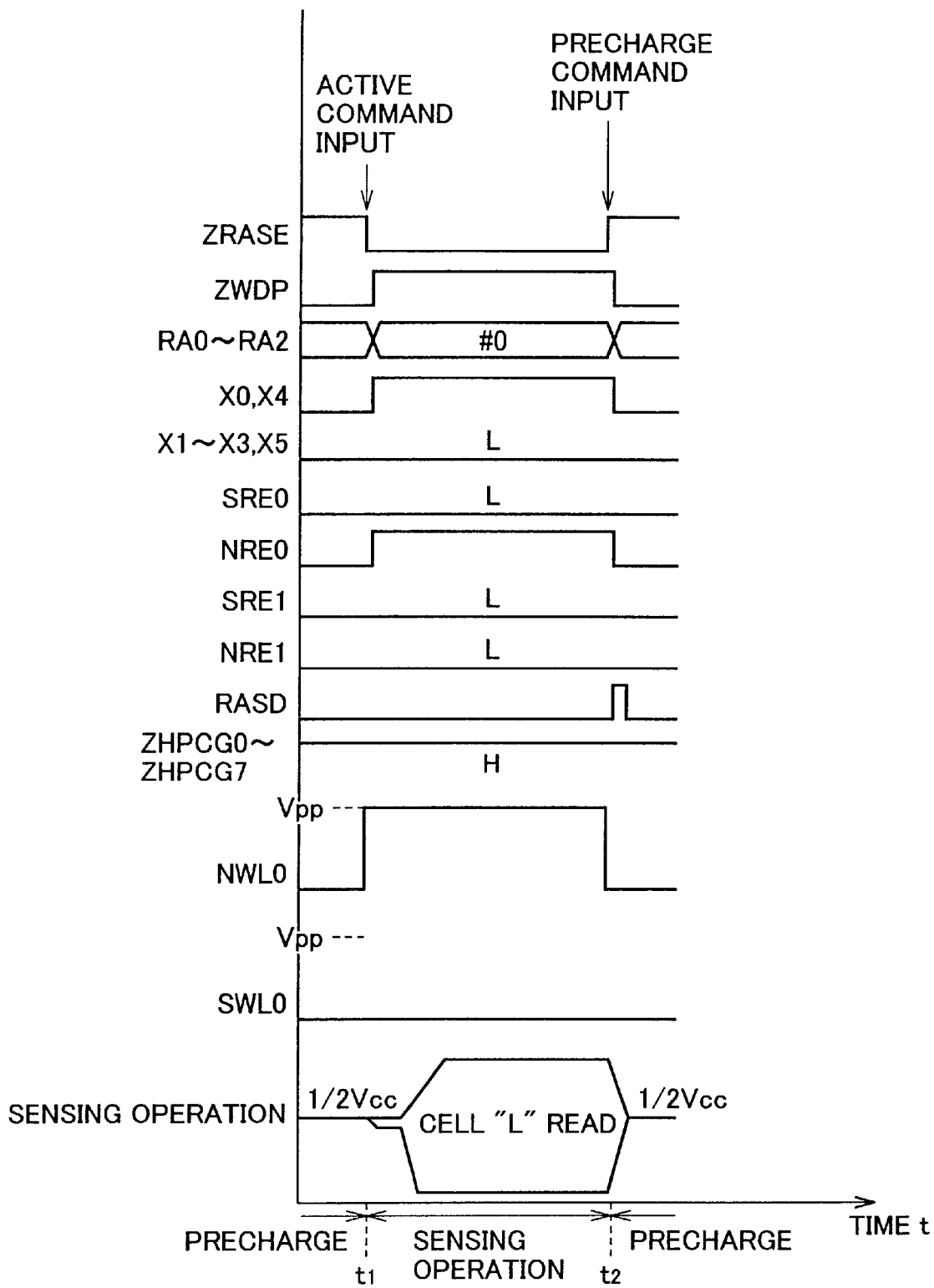
FIG. 13 is a timing chart illustrating the operation of activating a normal word line by the word line selection/activation circuit when no spare word line is used in the memory mat.

FIG. 13 is a timing chart illustrating the operation of activating the normal word line NWL0 by the word line selection/activation circuit 600 when no spare word line SWL is used in the memory mat 35.

When the spare word line SWL0 is not used, the fuses 80 to 83 in the spare row determination circuit 3 of FIG. 9 are not blown.

Referring to FIG. 13, the clock generation circuit 31 activates the control signal ZRASE (L level) at time t1 in response to an external control signal. At this time, the word driver precharge signal ZWDP output from the word driver precharge signal generation circuit 2 goes to H level.

Provided that a combination #0 of row address signals for selecting the normal word line NWL0 is applied from the outside, the row decoder 33 raises the decode signals X0 and X4 to H level. Note that, the decode signals other than the decode signals X0, X4 remain at L level.

Operation of the spare row determination circuit 3 at time t1 will be described.

At time t1, the decode signal X0 is at H level. Therefore, the N-channel MOS transistor 75 is turned on. Moreover, since the control signal ZRASE is at L level, the P-channel MOS transistor 70 is turned off. As a result, the signal SREF goes to L level, and the signal NREF goes to H level. The inverted signal of the L-level control signal ZRASE, the L-level signal SREF and the H-level decode signal X4 are thus applied to the logic gate 84. As a result, the determination signal SRE0 is at L level.

The inverted signal of the L-level control signal ZRASE, the H-level signal NREF and the H-level decode signal X4 are applied to the logic gate 85. As a result, the determination signal NRE0 is at H level.

Operation of the spare row determination circuit 4 at time t1 will now be described.

Since the decode signal X5 is at L level, the determination signals SRE1 and NRE1 of the spare row determination circuit 4 are both at L level.

Operation of the word line precharge signal generation circuit 7 at time t1 will now be described.

The control signal ZRASE goes to L level at time t1. At this time, in the word line precharge signal generation circuit 7, the pulse signal RASD output from the pulse signal generation circuit 128 remains at L level. Accordingly, the signal output from the logic gate 137 in the word line precharge signal generation circuit 120 is held at H level. The word line precharge signal ZHPCG0 output from the word line precharge signal generation unit 120 is thus held at H level.

The pulse generation signal RASD is applied also to the word line precharge signal generation units 121 to 127. Accordingly, the word line precharge signals ZHPCG1 to ZHPCG7 output from the word line precharge signal generation units 121 to 127 are held at H level.

Operation of the normal word line activation circuit 8 at time t1 will now be described.

Before time t1, the word driver precharge signal ZWDP is at L level. Accordingly, the P-channel MOS transistor 112 in the normal word driver 100 is turned on. Moreover, the word line precharge signals ZHPCG0 to ZHPC7 are at H level. As a result, the N-channel MOS transistor 111 is turned on, whereby the normal word line NWL0 is held at L level.

Since the normal word drivers 101 to 107 conduct the same operation as that of the normal word driver 100, the normal word lines NWL1 to NWL7 are held at L level.

The word driver precharge signal ZWDP goes to H level at time t1. Accordingly, the P-channel MOS transistor 112 in the normal word driver 100 is turned off. Moreover, the determination signal NRE0 output from the spare row determination circuit 3 goes to H level, whereby the N-channel MOS transistor 110 is turned on. Since the decode signal X0 is at H level, the N-channel MOS transistor 114 is turned on. The logic gate 117 receives the L-level signal from the inverter 115, whereby the N-channel MOS transistor 111 is turned off. As a result, the normal word line NWL0 is activated to H level.

Regarding the normal word drivers 101 to 103, the decode signals X1 to X3 are inactive, and the normal word lines NWL1 to NWL3 are therefore held at L level. Since the determination signal NRE1 is at L level, the normal word drivers 104 to 107 are rendered in a high impedance state. As a result, the normal word lines NWL4 to NWL7 are held at L level.

Operation of the spare word line activation circuit 5 at time t1 will be described.

Before time t1, the word driver precharge signal ZWDP is at L level, and the determination signal SRE0 is also at L level. As a result, the P-channel MOS transistor 92 and the N-channel MOS transistor 91 in the spare word driver 95 are turned ON, whereby the spare word line SWL0 is held at L level.

At time t1, the determination signal SRE0 remains at L level. Accordingly, the N-channel MOS transistor 90 remains in the OFF state. Since the word driver precharge signal ZWDP goes to H level at time t1, the P-channel MOS transistor 92 is turned off. As a result, the spare word driver 95 is rendered in a high impedance state, whereby the spare word line SWL0 is held inactive.

Since the operation of the spare word driver 96 is the same as that of the spare word driver 95, description thereof will not be repeated.

Thus, the control signal ZRASE is activated at time t1 in response to an active command for activating the sensing operation. The selected normal word line NWL0 is responsively activated, whereby the sensing operation is started.

Hereinafter, operation of the word line selection/activation circuit 600 after completion of the sensing operation at time t2 will be described.

At time t2, the control signal ZRASE is inactivated (H level) in response to a precharge command. As a result, the word driver precharge signal ZWDP goes to L level. At this time, the sensing operation is terminated, whereby the decode signals X0, X4 go to L level.

Operation of the spare row determination circuit 3 at time t2 will now be described.

The control signal ZRASE goes to H level at time t2, whereby the P-channel MOS transistor 70 is turned on. Since the decode signal X0 goes to L level, the N-channel MOS transistor 75 is turned off. As a result, the P-channel MOS transistor 71 is turned on, and the signal SREF goes to H level. The signal NREF goes to L level. Accordingly, the logic gate 84 receives an inverted signal of the H-level control signal ZRASE, the H-level signal SREF, and the L-level decode signal X4. As a result, the determination signal SRE0 is held at L level. On the other hand, the logic gate 85 receives an inverted signal of the H-level control signal ZRASE, the L-level signal NREF and the L-level decode signal X4. Accordingly, the determination signal NRE0 goes to L level.

Note that since the decode signal X5 remains at L level even at time t2, the determination signals SRE1, NRE1 output from the spare row determination circuits 4 are both held at L level.

Operation of the word line precharge signal generation circuit 7 at time t2 will now be described.

The control signal ZRASE goes to H level at time t2. As a result, the pulse signal generation circuit 128 activates the pulse signal RASD to H level for a period corresponding to the delay time of the delay stage 132. On the other hand, all of the determination signals SRE0, SRE1 and the decode signals X0 to X3 to be applied to the wordline precharge signal generation units 120 to 127 are at L level, the word line precharge signals ZHPCG0 to ZHPCG7 go to H level.

Operation of the normal word line activation circuit 8 at time t2 will now be described.

Since the determination signal NRE0 goes to L level at time t2, the N-channel MOS transistor 110 in the normal word driver 100 is turned off. Since the word driver precharge signal ZWDP goes to L level at time t2, the P-channel MOS transistor 112 is turned on. As a result, the N-channel MOS transistor 111 is turned on, whereby the normal word line NWL0 is inactivated (L level).

Since operation of the normal word line drivers 101 to 107 is the same as that described above, description thereof will not be repeated.

Operation of the spare word line activation circuit 5 at time t2 will now be described.

Since the word driver precharge signal ZWDP goes to L level at time t2, the P-channel MOS transistor 92 in the spare word driver 95 is turned on. Since the determination signal SRE0 remains at L level, the N-channel MOS transistor 90 is held in the OFF state. As a result, the N-channel MOS transistor 91 is turned on, and the spare word line SWL0 is held at L level.

Since operation of the spare word driver 96 is the same as that described above, description thereof will not be repeated.

According to the foregoing operation, the normal word line NWL0 activated in response to the active command is inactivated in response to the precharge command for terminating the sensing operation.

Hereinafter, operation of the word line selection/activation circuit 600 for activating the spare word line substituting for the defective normal word line NWL0 in the memory mat 35 will be described.

Figure 14:
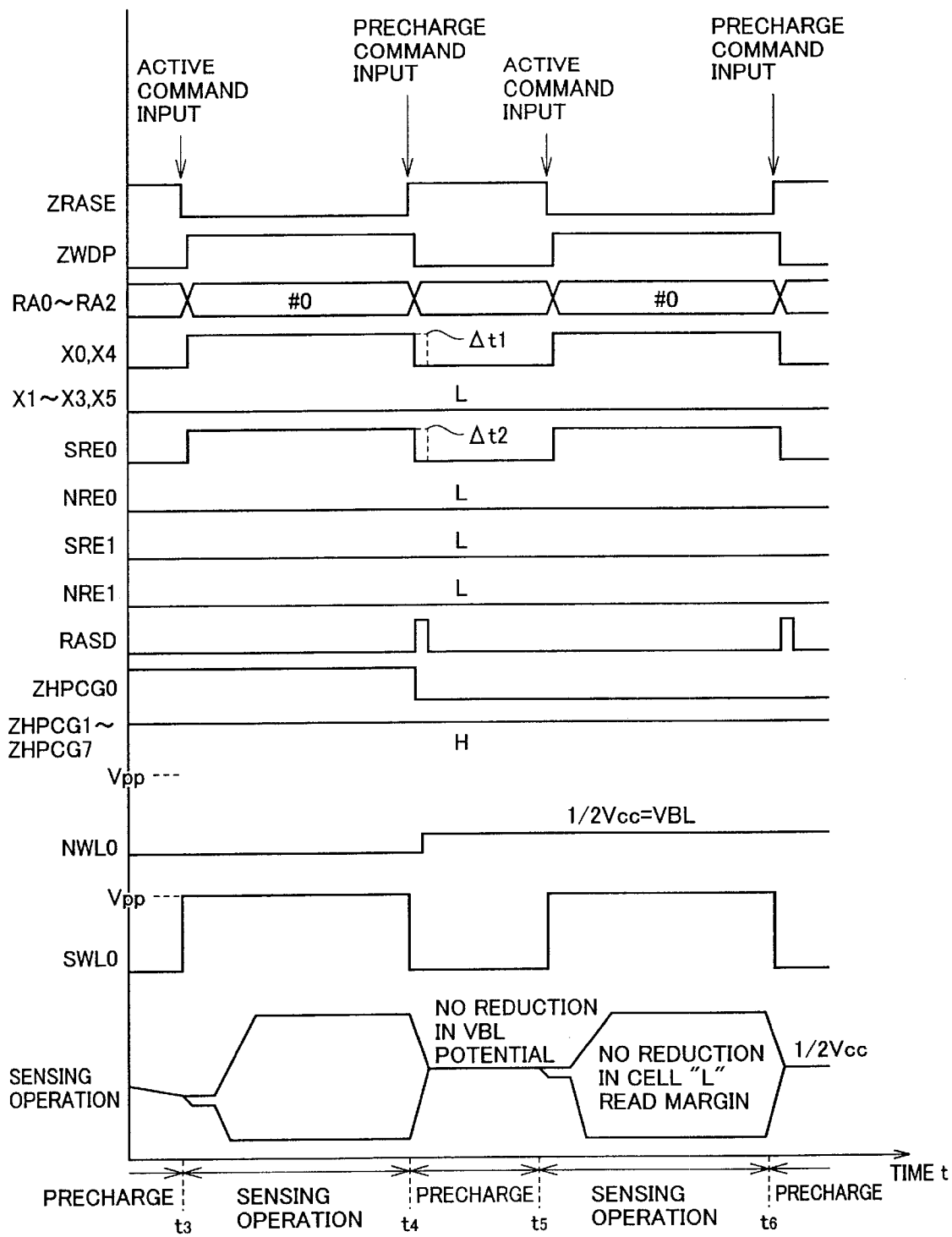
FIG. 14 is a timing chart illustrating the operation of the word line selection/activation circuit for activating a spare word line substituting for the defective normal word line in the memory mat.

FIG. 14 is a timing chart illustrating the operation of the word line selection/activation circuit 600 for activating the spare word line SWL0 substituting for the defective normal word line NWL0 in the memory mat 35.

When the normal word line NWL0 is defective, the fuse 83 in the spare row determination circuit 3 in FIG. 9 is blown in order to replace the defective normal word line NWL0 with the spare word line SWL0.

Referring to FIG. 14, an active command is applied as an external signal at time t3. In response to this, the clock generation circuit 31 activates the control signal ZRASE (L level). At this time, the word driver precharge signal ZWDP output from the word driver precharge signal generation circuit 2 goes to H level.

Provided that a row address for selecting the normal word line NWL0 is applied from the outside, the row decoder 33 raises the decode signals X0, X4 to H level. Note that the decode signals other than the decode signals X0, X4 remain at L level.

Operation of the spare row determination circuit 3 at time t3 will now be described.

Before time t3, the control signal ZRASE is at H level, and the P-channel MOS transistor 70 is therefore turned ON. As a result, the signal SREF goes to H level, and the signal NREF goes to L level.

At time t3, the control signal ZRASE is at L level, whereby the P-channel MOS transistor 70 is turned off. Since the decode signal X0 is at H level, the N-channel MOS transistor 75 is turned on. However, since the fuse 83 has been blown, the node N10 remains at H level. As a result, the signal SREF is held at H level, and the signal NREF is held at L level.

Accordingly, an inverted signal of the L-level control signal ZRASE, the H-level signal SREF, and the H-level decode signal X4 are applied to the logic gate 84, whereby the determination signal SRE0 goes to H level.

On the other hand, an inverted signal of the L-level control signal ZRASE, the L-level signal NREF and the H-level decode signal X4 are applied to the logic gate 85. Therefore, the determination signal NRE0 is at L level.

The decode signal X5 is at L level at time t3. Therefore, the determination signals SRE1 and NRE1 of the spare row determination circuit 4 are both at L level.

Operation of the word line precharge signal generation circuit 7 at time t3 will now be described.

The control signal ZRASE goes to L level at time t3. At this time, the pulse signal RASD output from the pulse signal generation circuit 128 remains at L level.

Accordingly, the signal output from the logic gate 137 in the word line precharge signal generation unit 120 is held at H level. The word line precharge signal ZHPCG0 output from the word line precharge signal generation unit 120 is therefore held at H level.

The pulse generation signal RASD is applied also to the word line precharge signal generation units 121 to 127. Accordingly, the word line precharge signals ZHPCG1 to ZHPCG7 output from the word line precharge signal generation units 121 to 127 are held at H level.

Operation of the normal word line activation circuit 8 at time t3 will now be described.

Since operation of the normal word line activation circuit 8 before time t3 is the same as that of the normal word line activation circuit 8 before time t1 in FIG. 13, description thereof will not be repeated.

At time t3, the word driver precharge signal ZWDP goes to H level. Accordingly, the P-channel MOS transistor 112 in the normal word driver 100 is turned off. Moreover, the determination signal NRE0 output from the spare row determination circuit 3 remains at L level. As a result, the N-channel MOS transistor 110 remains in the OFF state. Accordingly, the normal word driver 100 is rendered in a high impedance state, and the normal word line NWL0 is held at L level.

Since operation of the normal word drivers 101 to 107 is the same as that of the normal word driver 100, description thereof will not be repeated.

Operation of the spare word line activation circuit 5 at time t3 will now be described.

Since operation of the spare word line activation circuit 5 before time t3 is the same as that of the spare word line activation circuit 5 before time t1 in FIG. 13, description thereof will not be repeated.

At time t3, the determination signal SRE0 goes to H level. Therefore, the N-channel MOS transistor 90 is turned on. Since the word driver precharge signal ZWDP goes to H level at time t3, the P-channel MOS transistor 92 is turned off. As a result, the P-channel MOS transistor 93 is turned on, and the N-channel MOS transistor 91 is turned off. Accordingly, the spare word line SWL0 is activated (H level).

Since operation of the spare word driver 96 is the same as that of the spare word driver 96 at time t1 in FIG. 13, description thereof will not be repeated.

Thus, the control signal ZRASE is activated at time t3 in response to the active command. The selected normal word line NWL0 and the substitute spare word line SWL0 are responsively activated, whereby the sensing operation is started.

Hereinafter, operation of the word line selection/activation circuit 600 after completion of the sensing operation at time t4 will be described.

At time t4, the control signal ZRASE is inactivated (H level) in response to a precharge command. As a result, the word driver precharge signal ZWDP goes to L level. At this time, the sensing operation is terminated, whereby the decode signals X0, X4 go to L level.

Operation of the spare row determination circuit 3 at time t4 will now be described.

At time t4, the control signal ZRASE goes to H level, whereby the P-channel MOS transistor 70 is turned on. As a result, the signal SREF is held at H level, and the signal NREF is held at L level. Accordingly, the logic gate 84 receives an inverted signal of the H-level control signal ZRASE, the H-level signal SREF and the L-level decode signal X4. As a result, the determination signal SRE0 goes to L level. The determination signal NRE0 remains at L level.

The decode signal X5 remains at L level even at time t4. Accordingly, the determination signals SRE1, NRE1 output from the spare row determination circuit 4 are both held at L level.

Operation of the word line precharge signal generation circuit 7 at time 4 will now be described.

At time t4, the control signal ZRASE goes to H level. As a result, the pulse signal generation circuit 128 activates the pulse signal RASD to H level for a period corresponding to the delay time of the delay stage 132.

Hereinafter, operation of the word line precharge signal generation unit 120 will be described.

At time t4, the determination signal SRE0 and the decode signal X0 go to L level. However, the delay stage 135 delays the determination signal SRE0 by time Δt2, and the delay stage 136 delays the decode signal X0 by time Δt1. Accordingly, the logic gate 137 outputs an L-level signal at time t4. As a result, the word line precharge signal ZHPCG0 output from the word line precharge signal generation unit 120 is kept at L level after time t4.

Note that, since the decode signals X1 to X3 remain at L level, the word line precharge signals ZHPCG1 to ZHPCG3 of the word line precharge signal generation units 121 to 123 are held at H level.

Since operation of the word line precharge signal generation units 124 to 127 is the same as the operation at time t2 in FIG. 13, description thereof will not be repeated.

Operation of the normal word line activation circuit 8 at time t4 will now be described.

At time t4, the determination signal NRE0 remains at L level. Accordingly, the N-channel MOS transistor 110 in the normal word driver 100 is held in the OFF state. Since the word driver precharge signal ZWDP goes to L level at time t4, the P-channel MOS transistor 112 is turned on.

Since the word line precharge signal ZHPCG0 goes to L level at time t4, the N-channel MOS transistor 111 is held in the OFF state. On the other hand, the P-channel MOS transistor 113 is turned on, whereby the node N20 is connected to the node receiving the precharge potential VBL. Accordingly, the potential level on the defective normal word line NWL0 is kept at the precharge potential VBL level after time t4.

According to the foregoing operation, the precharged bit line pairs BL, ZBL have the same potential level as that of the defective normal word line NWL0 in a precharge period starting at time t4. Accordingly, even if the defective normal word line NWL0 is short-circuited with high resistance to the bit line BL or ZBL, the potential level on the precharged bit line pair BL, ZBL will not be reduced.

Since operation of the normal word drivers 110 to 107 is the same as the operation at time t2 in FIG. 13, description thereof will not be repeated.

Operation of the spare word line activation circuit 5 at time t4 will now be described.

At time t4, the word driver precharge signal ZWDP goes to L level. Therefore, the P-channel MOS transistor 92 in the spare word driver 95 is turned on. Moreover, the determination signal SRE0 goes to L level, whereby the N-channel MOS transistor 90 is turned off. As a result, the P-channel MOS transistor 93 is turned off, and the N-channel MOS transistor 91 is turned on. Accordingly, the spare word line SWL0 is inactivated (L level).

Operation of the spare word driver 96 is the same as the operation at time t2 in FIG. 13.

Note that, provided that the control signal ZRASE goes back to L level at time t5, the word driver precharge signal generation circuit 2, the spare row determination circuits 3, 4 and the spare word line activation circuit 5 operate in the same manner as that at time t3.

In the word line precharge signal generation circuit 7, the output signal of the logic gate 138 in the word line precharge signal generation unit 120 is kept at H level after time t4. Accordingly, the word line precharge signal ZHPCG0 remains at L level even at time t5. As a result, the defective normal word line NWL0 is held at the precharge potential VBL level even at time t5.

According to the aforementioned operation, the word line selection/activation circuit 600 renders the defective normal word line NWL replaced with the spare word line SWL at the precharge potential VBL level. This prevents reduction in potential level on the bit line pair during the precharge period, and thus prevents reduction in L-level read margin of the sensing operation.

[Second Embodiment]

In the first embodiment, the defective normal word line NWL short-circuited to the bit line BL or ZBL is rendered at the precharge potential VBL level in order to prevent reduction in potential level on the bit line pair BL, ZBL during the precharge period.

However, when the defective normal word line NWL short-circuited to the bit line BL or ZBL is kept at the precharge potential VBL level, the bit line BL or ZBL short-circuited to the defective normal word line NWL also tends to remain at the precharge potential VBL level, thereby hindering the sensing operation. Accordingly, it is more desirable to facilitate transition of even the potential level on the bit line BL or ZBL short-circuited to the defective normal word line NWL during the sensing operation.

Figure 15:
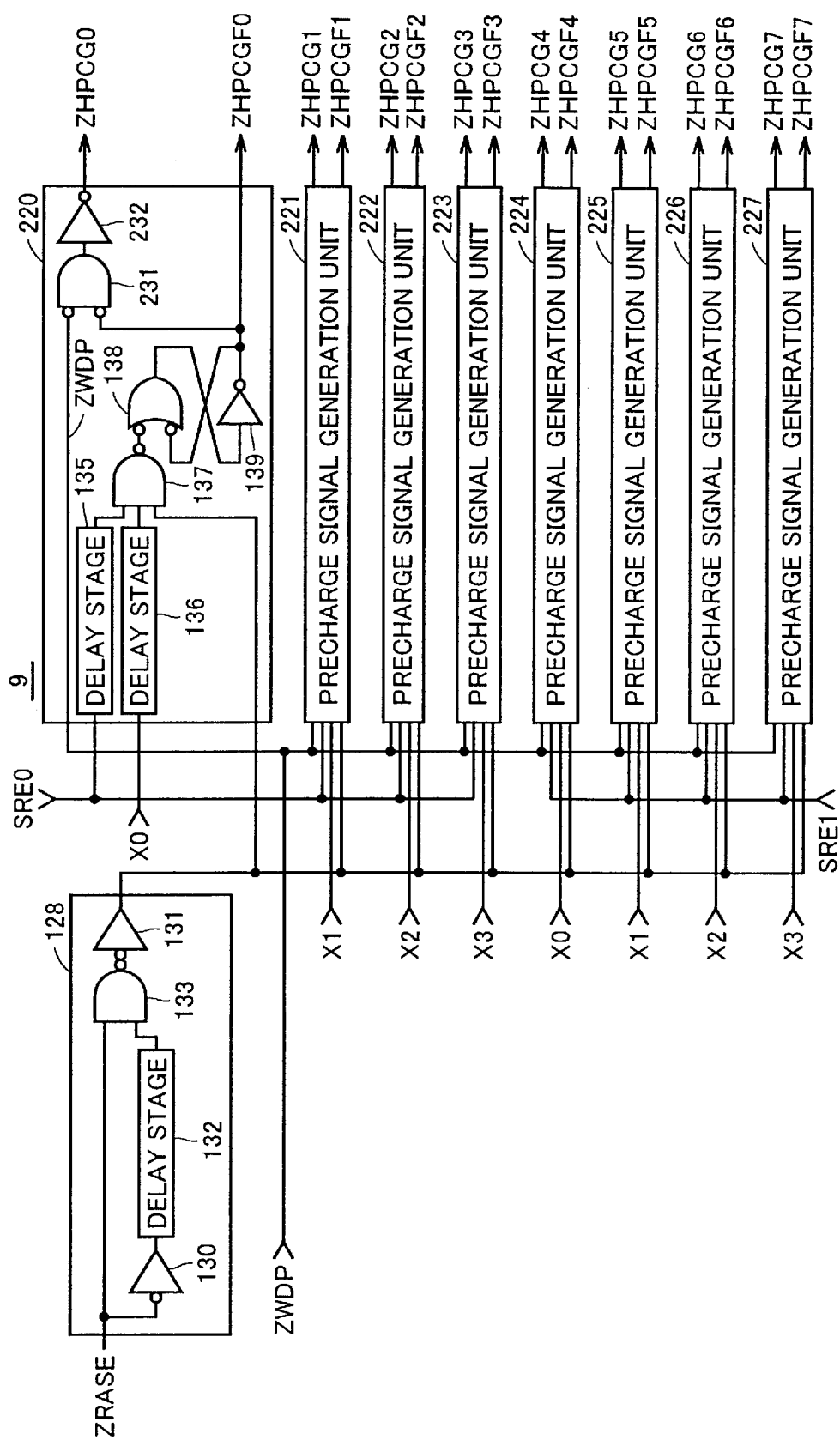
FIG. 15 is a circuit diagram showing the configuration of a word line precharge signal generation circuit according to a second embodiment of the present invention.

FIG. 15 is a circuit diagram showing the configuration of a word line precharge signal generation circuit 9 according to the second embodiment of the present invention.

Referring to FIG. 15, the word line precharge signal generation circuit 9 includes a pulse signal generation circuit 128, and word line precharge signal generation units 220 to 227.

Since the pulse signal generation circuit 128 has the same configuration as that of FIG. 12, description thereof will not be repeated.

The word line precharge signal generation unit 220 is different from the word line precharge signal generation unit 120 in FIG. 12 in that the word line precharge signal generation unit 220 additionally includes a logic gate 231 and an inverter 232.

The inverter 139 inverts the output signal of the logic gate 138 for output as a signal ZHPCGF0. The logic gate 231 receives the word driver precharge signal ZWDP and the signal ZHPCGF0, and outputs the NOR operation result thereof. The inverter 232 inverts the output signal of the logic gate 231 for output as a word line precharge signal ZHPCG0. Since the word line precharge signal generation unit 220 has otherwise the same structure as that of the word line precharge signal generation unit 120 in FIG. 12, description thereof will not be repeated.

Since the word line precharge signal generation units 221 to 227 have the same configuration as that of the word line precharge signal generation unit 220, description thereof will not be repeated.

Figure 16:
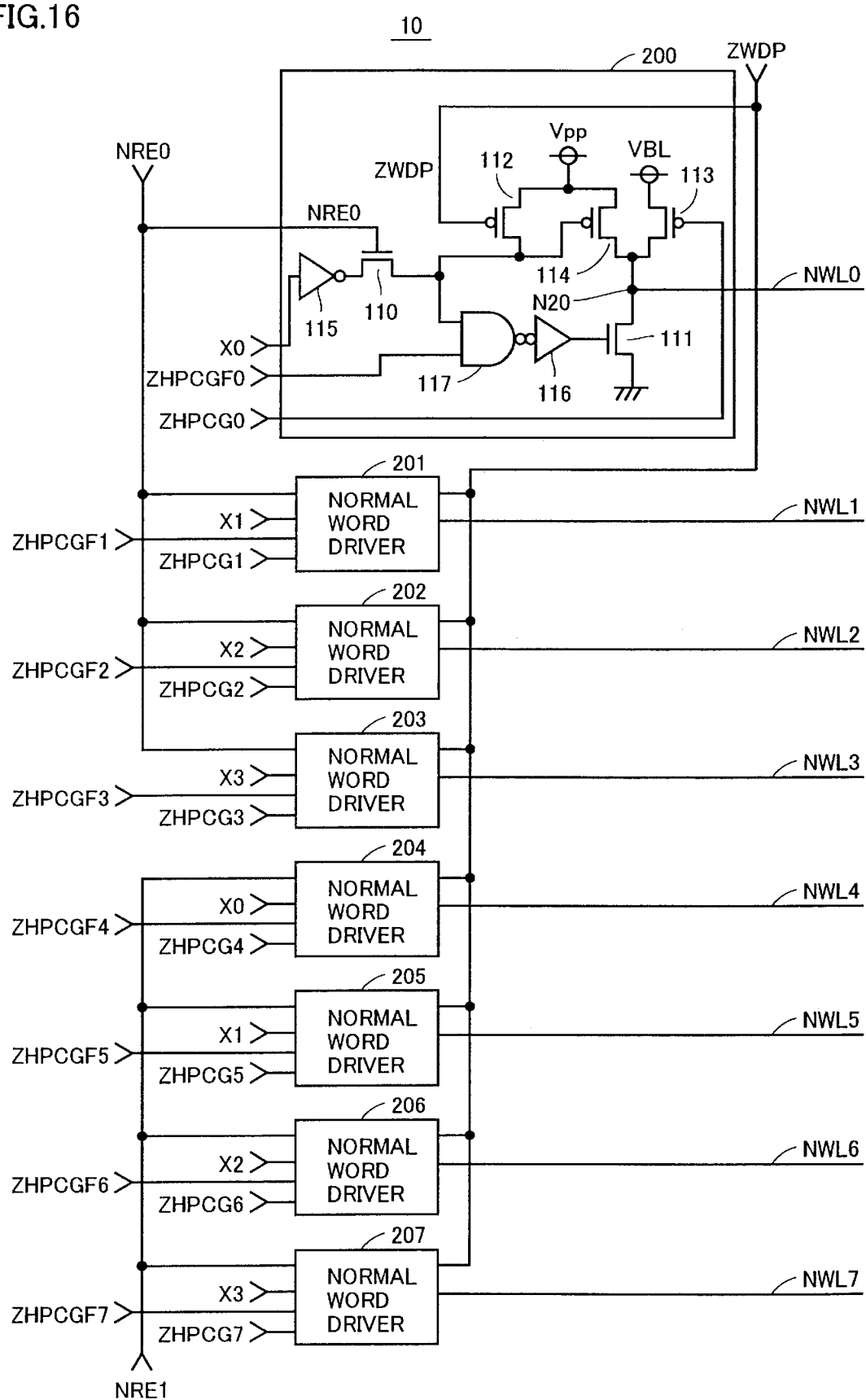
FIG. 16 is a circuit diagram showing the configuration of a normal word line activation circuit according to the second embodiment.

FIG. 16 is a circuit diagram showing the configuration of a normal word line activation circuit 10 according to the second embodiment.

Referring to FIG. 16, the normal word line activation circuit 10 includes normal word drivers 200 to 207.

The normal word driver 200 is different from the normal word driver 100 in FIG. 11 in that the signal ZHPCGF0 is applied to the logic gate 117 instead of the word line precharge signal ZHPCG0. Since the normal word driver 200 has otherwise the same structure as that of the normal word driver 100, description thereof will not be repeated.

Since the normal word drivers 201 to 207 have the same configuration as that of the normal word driver 200, description thereof will not be repeated.

Hereinafter, operation of the word line selection/activation circuit 600 including the word line precharge signal generation circuit 9 and the normal word line activation circuit 10 having the aforementioned configuration will be described.

Note that the word line precharge signal generation circuit 9 is provided instead of the word line precharge signal generation circuit 7 in FIG. 6, and the normal world line activation circuit 10 is provided instead of the normal word line activation circuit 8 in FIG. 6.

Figure 17:
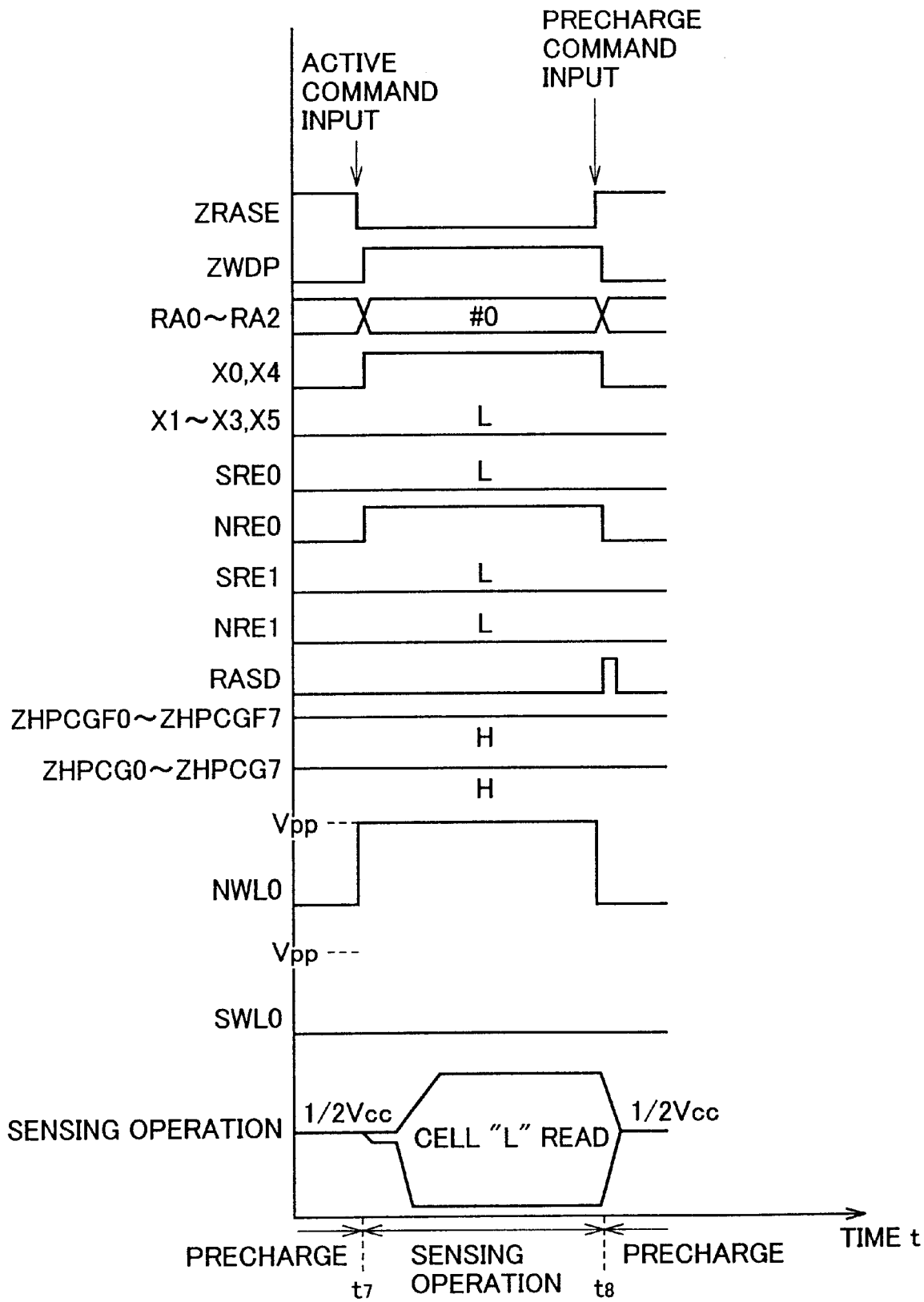
FIG. 17 is a timing chart illustrating the operation of activating the normal word line by the word line selection/activation circuit when no spare word line is used in the memory mat.

FIG. 17 is a timing chart illustrating the operation of activating the normal word line NWL0 by the word line selection/activation circuit 600 when no spare word line SWL is used in the memory mat 35.

Referring to FIG. 17, operation of the spare row determination circuits 3, 4, the word driver precharge signal generation circuit 2, and the spare word line activation circuit 5 at time t7 is the same as the operation at time t1 in FIG. 13, description thereof will not be repeated.

Operation of the word line precharge signal generation circuit 9 at time t7 will now be described.

At time t7, the control signal ZRASE goes to L level. At this time, the pulse signal RASD output from the pulse signal generation circuit 128 remains at L level. Accordingly, the output signal of the logic gate 137 in the word line precharge signal generation unit 220 remains at H level, and the output signal ZHPCGF0 of the inverter 139 remains at H level.

The logic gate 231 receives the H-level signal ZHPCGF0 and the H-level word driver precharge signal ZWDP, and outputs an L-level signal. As a result, the word line precharge signal ZHPCG0 output from the inverter 232 is held at H level.

The pulse generation signal RASD is applied also to the word line precharge signal generation units 221 to 227. Therefore, the signals ZHPCGF1 to ZHPCGF7 and the word line precharge signals ZHPCG1 to ZHPCG7 output from the word line precharge signal generation units 221 to 227 are held at H level.

Operation of the normal word line activation circuit 10 at time t7 will be described.

Before time t7, the word driver precharge signal ZWDP is at L level. Therefore, the P-channel MOS transistor 112 in the normal word driver 200 is turned on. The signals ZHPCGF0 to ZHPCGF7 are at H level. As a result, the N-channel MOS transistor 111 is turned on. Since the word line precharge signals ZHPCG0 to ZHPCG7 are also at H level, the P-channel MOS transistor 113 remains in the OFF state. Accordingly, the normal word line NWL0 is retained at L level.

Since the normal word drivers 201 to 207 operate in the same manner as that of the normal word driver 200, the normal word lines NWL1 to NWL7 are retained at L level.

At time t7, the word driver precharge signal ZWDP goes to H level. Accordingly, the P-channel MOS transistor 112 in the normal word driver 200 is turned off. Moreover, the determination signal NRE0 output from the spare row determination circuit 3 goes to H level, whereby the N-channel MOS transistor 110 is turned on. At this time, the decode signal X0 is at H level, whereby the N-channel MOS transistor 114 is turned on. On the other hand, the logic gate 117 receives an L-level signal from the inverter 115. Therefore, the N-channel MOS transistor 111 is turned off. The normal word line NWL0 is thus activated to H level.

Regarding the normal word drivers 201 to 203, the decode signals X1 to X3 are inactive. Therefore, the normal word lines NWL1 to NWL3 are held at L level. Since the determination signal NRE1 is at L level, the normal word drivers 204 to 207 are rendered in a high impedance state. As a result, the normal word lines NWL4 to NWL7 are held at L level.

Hereinafter, operation of the word line selection/activation circuit 600 at time t8 will be described.

Since operation of the spare row determination circuits 3, 4, the word driver precharge signal generation circuit 2 and the spare word line activation circuit 5 at time t8 is the same as the operation at time t1 in FIG. 13, description thereof will not be repeated.

Operation of the word line precharge signal generation circuit 9 at time t8 will now be described.

At time t8, the control signal ZRASE goes to, H level. As a result, the pulse signal generation circuit 128 activates the pulse signal RASD to H level for a period corresponding to the delay time of the delay stage 132. On the other hand, the determination signals SRE0, SRE1 and the decode signals X0 to X3 to be applied to the word line precharge signal generation units 220 to 227 are at L level. Therefore, the signals ZHPCGF0 to ZHPCGF7 and the word line precharge signals ZHPCG0 to ZHPCG7 are at H level.

Operation of the normal word line activation circuit 8 at time t8 will now be described.

At time t8, the determination signal NRE0 goes to L level, whereby the N-channel MOS transistor 110 in the normal word driver 200 is turned off. On the other hand, the word driver precharge signal ZWDP goes to L level, whereby the P-channel MOS transistor 112 is turned on. As a result, the N-channel MOS transistor 111 is turned on, and the normal word line NWL0 is inactivated (L level).

Hereinafter, operation of the word line selection/activation circuit 600 for activating the spare word line SWL0 substituting for the defective normal word line NWL0 in the memory mat 35 will be described.

Figure 18:
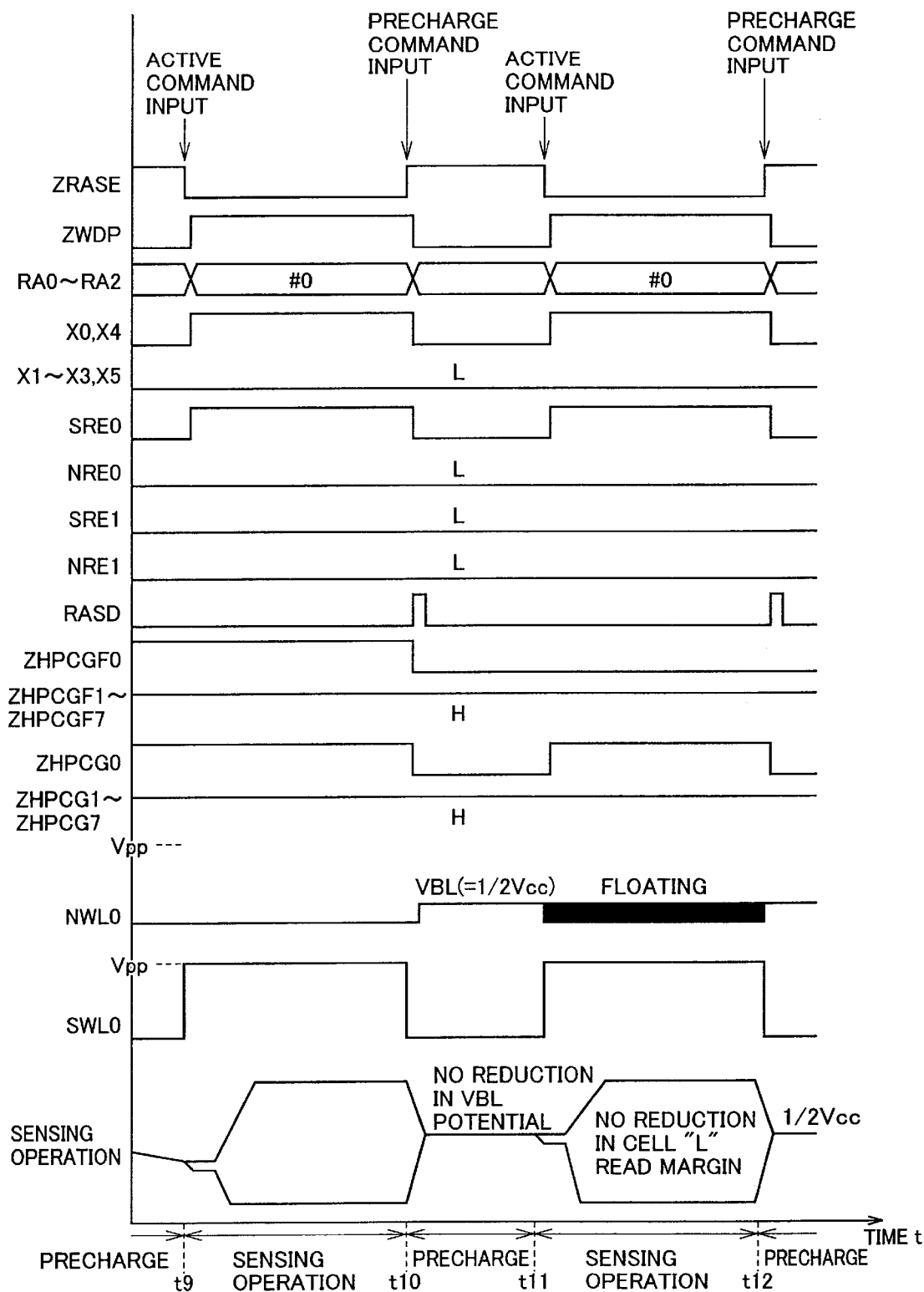
FIG. 18 is a timing chart illustrating the operation of the word line selection/activation circuit for activating the spare word line substituting for the defective normal word line in the memory mat.

FIG. 18 is a timing chart illustrating the operation of the word line selection/activation circuit 600 for activating the spare word line substituting for the defective normal word line NWL0 in the memory mat 35.

Referring to FIG. 18, since operation of the spare row determination circuits 3, 4, the word driver precharge signal generation circuit 2, and the spare word line activation circuit 5 at time t9 is the same as that at time t3 in FIG. 14, description thereof will not be repeated.

Operation of the word line precharge signal generation circuit 9 at time t9 will now be described.

At time t9, the control signal ZRASE goes to L level. At this time, the pulse signal RASD output from the pulse signal generation circuit 128 remains at L level. Accordingly, the output signal of the logic gate 137 in the word line precharge signal generation unit 220 is retained at H level. Accordingly, the signal ZHPCGF0 and the word line precharge signal ZHPCG0 output from the word line precharge signal generation unit 220 both remain at H level.

The pulse generation signal RASD is applied also to the word line precharge signal generation units 221 to 227. Accordingly, the signals ZHPCGF1 to ZHPCGF7 and the word line precharge signals ZHPCG1 to ZHPCG7 output from the word line precharge signal generation units 221 to 227 remain at H level.

Operation of the normal word line activation circuit 10 at time t9 will now be described.

Since operation of the normal word line activation circuit 10 before time t9 is the same as the operation of the normal word line activation circuit 8 before time t1 in FIG. 13, description thereof will not be repeated.

At time t9, the word driver precharge signal ZWDP goes to H level. Accordingly, the P-channel MOS transistor 112 in the normal word driver 200 is turned off. Moreover, the determination signal NRE0 output from the spare row determination circuit 3 remains at L level. As a result, the N-channel MOS transistor 110 remains in the OFF state. The normal word driver 200 is thus rendered in a high impedance state, and the normal word line NWL0 is retained at L level.

Since operation of the normal word drivers 201 to 207 is the same as that of the normal word driver 200, description thereof will not be repeated.

Operation of the word line selection/activation circuit 600 after completion of the sensing operation at time t10 will now be described.

Since operation of the spare row determination circuits 3, 4, the word driver precharge signal generation circuit 3 and the spare word line activation circuit 5 at time t10 is the same manner as the operation at time t4 in FIG. 14, description thereof will not be repeated.

Operation of the word line precharge signal generation circuit 9 at time t10 will now be described.

At time t10, the control signal ZRASE goes to H level. As a result, the pulse signal generation circuit 128 activates the pulse signal RASD to H level for a period corresponding to the delay time of the delay stage 132.

The logic gate 137 in the word line precharge signal generation unit 220 outputs an L-level signal. Therefore, the signal ZHPCGF0 output from the word line precharge signal generation unit 220 goes to L level.

Note that the logic gate 138 continuously outputs an H-level signal after time t10. Therefore, the signal ZHPCGF0 is kept at L level after time t10.

Since the word driver precharge signal ZWDP goes to L level, the word line precharge signal ZHPCG0 goes to L level at time t10.

Note that, in the word line precharge signal generation units 221 to 223, the decode signals X1 to X3 remain at L level. Therefore, the signals ZHPCGF1 to ZHPCGF3 and the word line precharge signals ZHPCG1 to ZHPCG3 remain at H level.

Since operation of the word line precharge signal generation units 224 to 227 at time t10 is the same as the operation at time t2 in FIG. 13, description thereof will not be repeated.

Operation of the normal word line activation circuit 10 at time t10 will now be described.

At time t10, the determination signal NRE0 remains at L level. Accordingly, the N-channel MOS transistor 110 in the normal word driver 200 remains in the OFF state. On the other hand, the word driver precharge signal ZWDP goes to L level, whereby the P-channel MOS transistor 112 is turned on.

Since the signal ZHPCGF0 goes to L level at time t10, the N-channel MOS transistor 111 is held in the OFF state. On the other hand, the word line precharge signal ZHPCG0 also goes to L level, whereby the P-channel MOS transistor 113 is turned on, whereby the node N20 is connected to the node receiving the precharge potential VBL. Accordingly, the potential level on the defective normal word line NWL0 is held at the precharge potential VBL level after time t10.

According to the foregoing operation, even when the defective normal word line NWL0 is short-circuited with high resistance to the bit line BL or ZBL, the potential level on the precharged bit line pair BL, ZBL will not be reduced during the precharge period starting at time t10.

Since operation of the normal word drivers 201 to 207 is the same as the operation at time t2 in FIG. 13, description thereof will not be repeated.

Hereinafter, operation of the word line precharge signal generation circuit 9 and the normal word line activation circuit 10 for starting the sensing operation again at time t11 will be described.

As described above, the signal ZHPCGF0 output from the word line precharge signal generation unit 220 is kept at L level after time t10. Accordingly, provided that the word driver precharge signal ZWDP goes to H level at time t1, the output signal of the logic gate 231 goes to L level. As a result, the word line precharge signal ZHPCG0 output from the word line precharge signal generation unit 220 goes to H level.

Since operation of the other word line precharge signal generation units 221 to 227 is the same as the operation at time t9, description thereof will not be repeated.

At time t11, the word line precharge signal ZHPCG0 goes to H level. Therefore, the P-channel MOS transistor 113 in the normal word line activation circuit 10 is turned off. Moreover, due to the signal ZHPCGF0, the N-channel MOS transistor 111 is kept in the OFF state after time t10. Since the determination signal NRE0 is at L level, the N-channel MOS transistor 110 remains in the OFF state. As a result, the normal word driver 200 is rendered in a high impedance state at time t11. Thus, the defective normal word line NWL0 is rendered at a floating potential level during the sensing operation starting at time t11.

Note that, at time t2, that is, when the sensing operation is terminated, the word driver precharge signal ZWDP goes to L level, whereby the word line precharge signal ZHPCG0 goes back to L level. As a result, the defective normal word line NWL0 is again held at the precharge potential VBL level.

Since operation of the normal word drivers 201 to 207 after time t11 is the same as the operation at time t9, description thereof will not be repeated.

According to the foregoing operation, the word line selection/activation circuit of the second embodiment holds the defective normal word line NWL replaced with the spare word line SWL at the precharge potential VBL level during the precharge period.

During the sensing operation, the defective normal word line NWL is rendered at a floating potential level. This facilitates transition of the short-circuited bit line BL or ZBL to L level, thereby facilitating the sensing operation.

[Third Embodiment]

Figure 19:
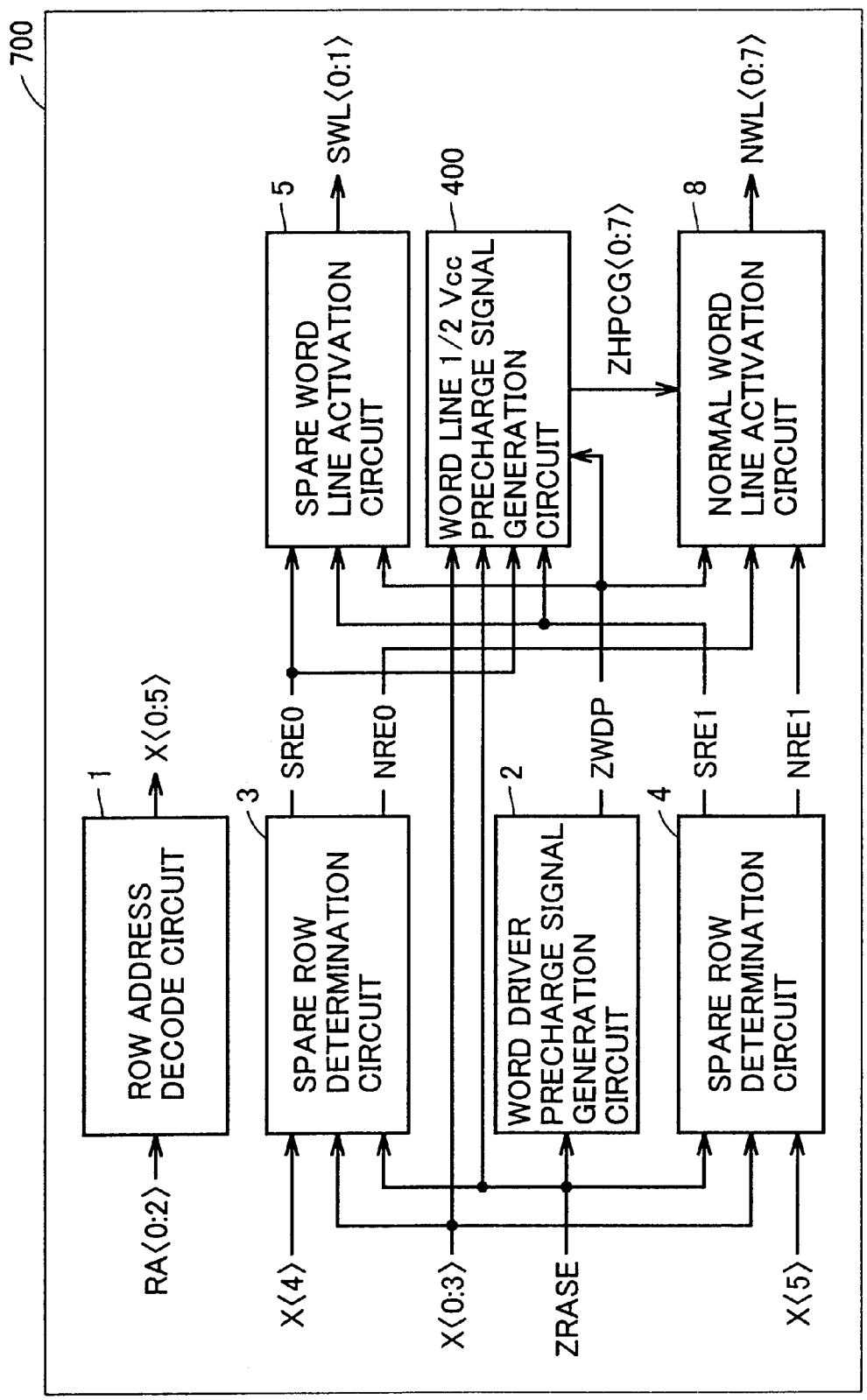
FIG. 19 is a schematic block diagram showing the configuration of a word line selection/activation circuit according to a third embodiment of the present invention.

FIG. 19 is a schematic block diagram showing the configuration of a word line selection/activation circuit according to the third embodiment of the present invention.

Referring to FIG. 19, the word line selection/activation circuit 700 includes a word line precharge signal generation circuit 400 instead of the word line precharge signal generation circuit 7 in the word line selection/activation circuit 600 in FIG. 6. Since the word line selection/activation circuit 700 has otherwise the same configuration as that of the word line selection/activation circuit 600, description thereof will not be repeated.

Figure 20:
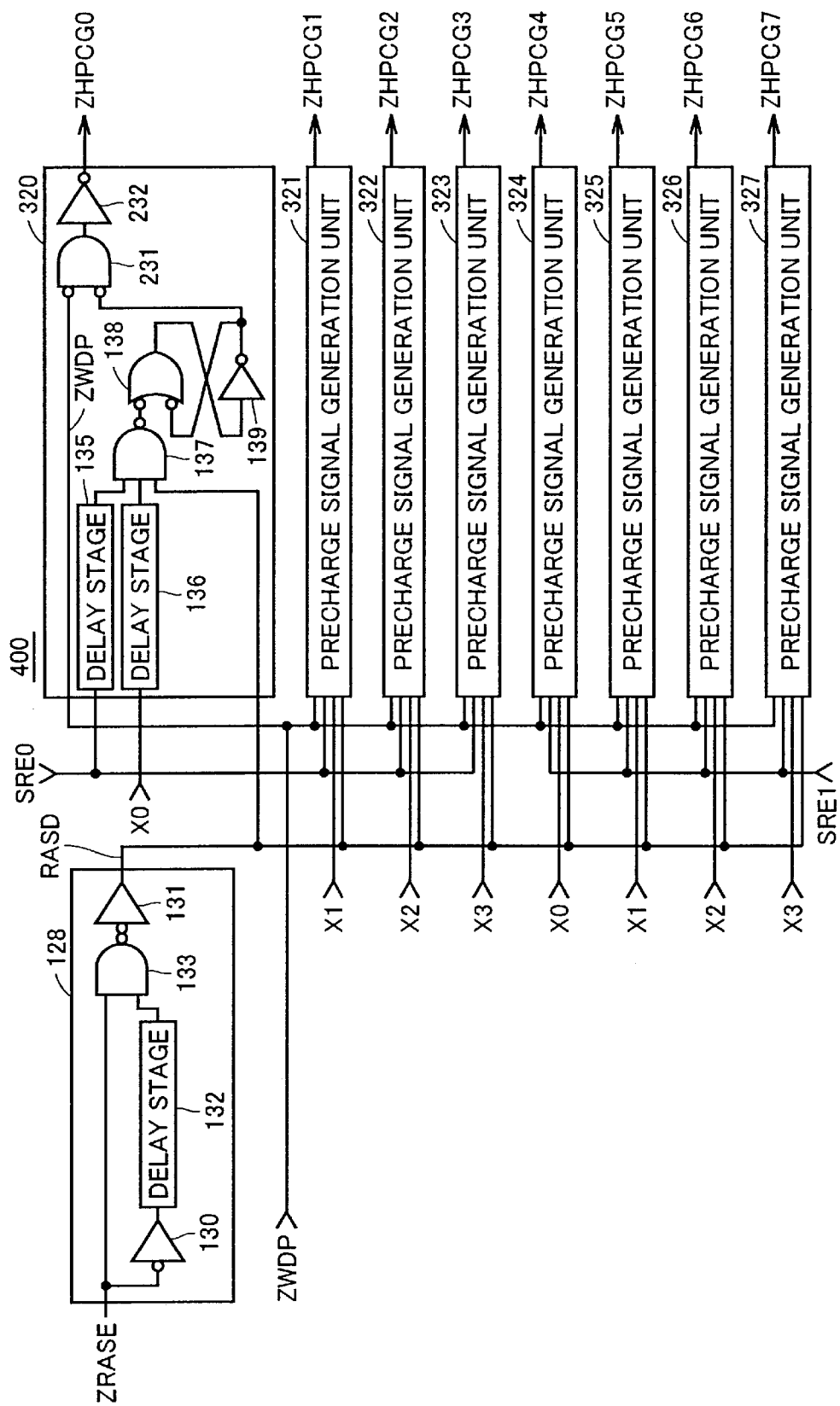
FIG. 20 is a circuit diagram showing the configuration of a word line precharge signal generation circuit in FIG. 19.

FIG. 20 is a circuit diagram showing the configuration of the word line precharge signal generation circuit 400 in FIG. 19.

Referring to FIG. 20, the word line precharge signal generation circuit 400 is different from the word line precharge signal generation circuit 9 in FIG. 15 in that the signal ZHPCGF is not output from each word line precharge signal generation unit. Accordingly, in the word line precharge signal generation circuit 400, only the word line precharge signals ZHPCG0 to ZHPCG7 are output from the word line precharge signal generation units 320 to 327.

The circuit configuration is otherwise the same as that shown in FIG. 15.

Hereinafter, operation of the word line selection/activation circuit 700 having the aforementioned structure will be described.

Regarding the operation of activating the normal word line NWL0 by the word line selection/activation circuit 700 when no spare word line SWL is used in the memory mat 35, the timing chart is the same as that shown in FIG. 17. Therefore, description thereof will not be repeated.

Figure 21:
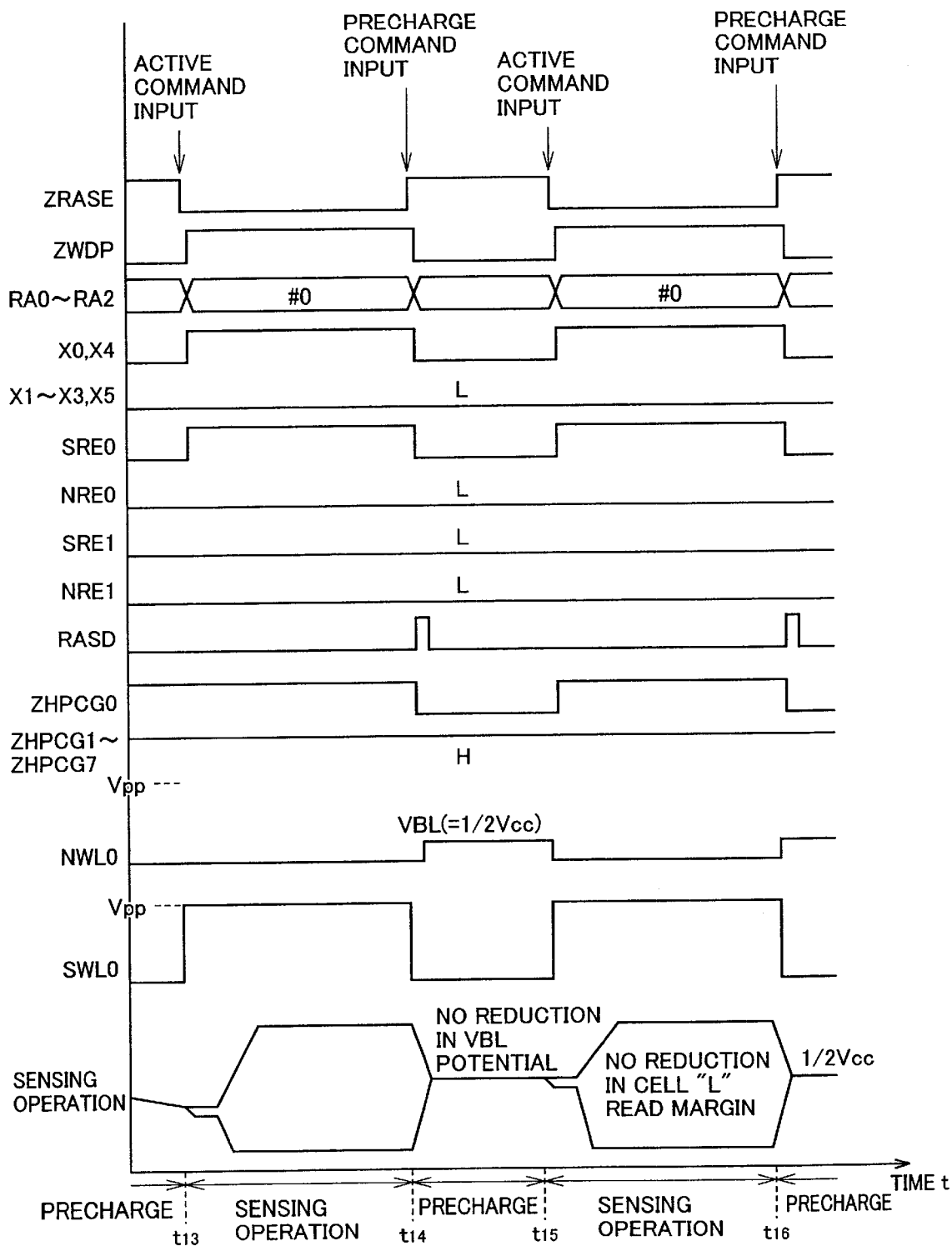
FIG. 21 is a timing chart illustrating the operation of a word line selection/activation circuit for activating the spare word line substituting for the defective normal word line in the memory mat.
Figure 22:
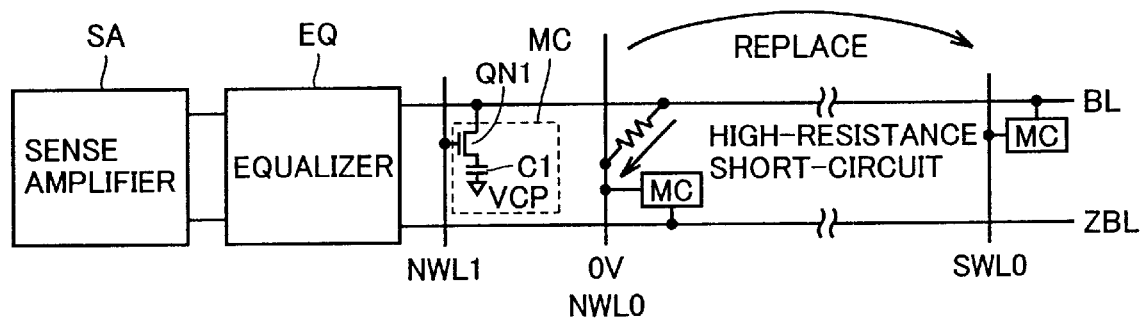
FIG. 22 is a schematic block diagram showing a region in a memory cell array of the DRAM.
Figure 23:
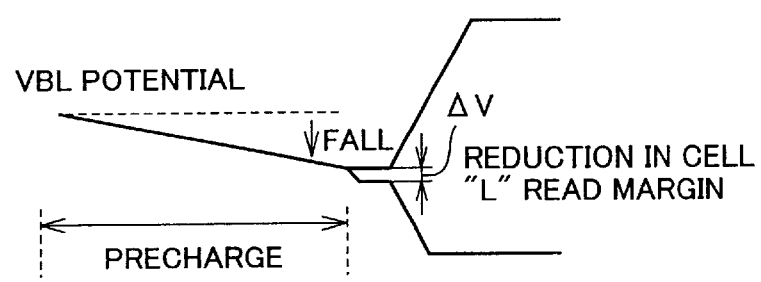
FIG. 23 is a timing chart illustrating the operation of reading L level in a memory cell (which is a part of the sense amplifier operation) in the case where a bit line BL is short-circuited with high resistance to a defective normal word line in FIG. 22.

FIG. 21 is a timing chart illustrating the operation of the word line selection/activation circuit 700 for activating the spare word line substituting for the defective normal word line NWL0 in the memory mat 35.

Referring to FIG. 21, since operation of the word line selection/activation circuit 700 at time t13 and t14 is the same as the operation at time t9 and t10 in FIG. 18, description thereof will not be repeated.

Operation of the normal word line activation circuit 8 for starting the sensing operation again at time t15 will now be described.

At time t15, the word line precharge signal ZHPCG0 output from the word line precharge signal generation circuit 400 goes to H level. Accordingly, the N-channel MOS transistor 111 in the normal word driver 100 is turned on. The P-channel MOS transistor 113 is turned off. As a result, the potential level on the defective normal word line NWL0 falls from the precharge potential VBL level to the ground level.

This facilitates transition of the bit line BL or ZBL short-circuited to the defective normal word line NWL0 to L level during the sensing operation.

Since operation of the normal word drivers 101 to 107 is the same as the operation at time t5 in FIG. 14, description thereof will not be repeated.

Note that, at time t16, that is, when the sensing operation is terminated, the word driver precharge signal ZWDP goes to L level, whereby the word line precharge signal ZHPCG0 goes back to L level. As a result, the defective normal word line NWL0 is again held at the precharge potential VBL level.

According to the foregoing operation, the word line selection/activation circuit of the third embodiment holds the defective normal word line NWL replaced with the spare word line SWL at the precharge potential VBL level during the precharge period.

During the sensing operation, the potential level on the defective normal word line NWL is reduced to the ground potential level. This facilitates transition of the short-circuited bit line BL or ZBL to L level, thereby facilitating the sensing operation.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor integrated circuit device, comprising:

a plurality of memory cells arranged in rows and columns;

a plurality of normal word lines corresponding to said rows;

a plurality of spare word lines corresponding to said rows;

a plurality of bit line pairs corresponding to said columns;

an equalizer circuit for precharging said plurality of bit line pairs to a prescribed potential;

a sense amplifier circuit for amplifying potential differences in said bit line pairs;

a spare row determination circuit for replacing a defective normal word line of said plurality of word lines with one of said plurality of spare word lines; and a word line precharge circuit for precharging said defective normal word line replaced by said spare row determination circuit to said prescribed potential.

2. The semiconductor integrated circuit device according to claim 1, wherein said word line precharge circuit includes a word line precharge determination circuit for determining whether the replaced defective normal word line is to be precharged to said predetermined potential or not, and a word line potential control circuit for controlling a potential on said replaced defective normal word line in response to the determination result of said word line precharge determination circuit.

3. The semiconductor integrated circuit device according to claim 2, wherein said word line precharge determination circuit outputs a determination signal to said word line potential control circuit in response to a control signal for controlling operation of said sense amplifier circuit.

4. The semiconductor integrated circuit device according to claim 3, wherein said word line precharge circuit sets said replaced defective normal word line in a high impedance state during operation of said sense amplifier circuit.

5. The semiconductor integrated circuit device according to claim 3, wherein said word line precharge circuit reduces the potential on said replaced defective normal word line during operation of said sense amplifier circuit.

* * * * *